US008593860B2

(12) United States Patent
Shu et al.

(10) Patent No.: US 8,593,860 B2
(45) Date of Patent: *Nov. 26, 2013

(54) SYSTEMS AND METHODS OF SECTIONED BIT LINE MEMORY ARRAYS

(75) Inventors: LeeLean Shu, Los Altos, CA (US); Chenming W. Tung, Fremont, CA (US); Hsin You S. Lee, Campbell, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/316,391

(22) Filed: Dec. 9, 2011

(65) Prior Publication Data
US 2013/0148414 A1    Jun. 13, 2013

(51) Int. Cl.
*G11C 11/00* (2006.01)

(52) U.S. Cl.
USPC .............. 365/154; 365/51; 365/53; 365/63; 365/189.08; 365/230.03

(58) Field of Classification Search
USPC ............ 365/154, 51, 63, 189.08, 230.03
See application file for complete search history.

(56) References Cited

U.S. PATENT DOCUMENTS

| 4,839,862 | A | 6/1989 | Shiba et al. |
| 5,291,444 | A | 3/1994 | Scott et al. |
| 5,355,343 | A | 10/1994 | Shu et al. |
| 5,914,906 | A * | 6/1999 | Iadanza et al. ........... 365/230.03 |
| 5,923,605 | A | 7/1999 | Mueller et al. |
| 5,949,732 | A | 9/1999 | Kirihata |
| 6,091,629 | A | 7/2000 | Osada et al. |
| 6,452,851 | B1 | 9/2002 | Endo et al. |
| 6,522,565 | B2 | 2/2003 | Shimazaki et al. |
| 6,665,204 | B2 | 12/2003 | Takeda |
| 6,674,678 | B2 | 1/2004 | Kato |
| 6,901,017 | B2 | 5/2005 | Shimizu |
| 6,930,902 | B2 | 8/2005 | Mayer et al. |
| 7,061,802 | B2 | 6/2006 | Nakai |
| 7,102,928 | B2 | 9/2006 | Kawamura |
| 7,102,946 | B2 | 9/2006 | Pelella |
| 7,313,023 | B2 | 12/2007 | Li et al. |

(Continued)

FOREIGN PATENT DOCUMENTS

| EP | 0 834 881 A1 | 8/1998 |
| JP | 11185468 A | 7/1999 |

(Continued)

OTHER PUBLICATIONS

International Search Report and Written Opinion for PCT/US2012/68833 dated Apr. 23, 2013, 17 pgs.

*Primary Examiner* — Connie Yoha
(74) *Attorney, Agent, or Firm* — DLA Piper LLP (US)

(57) ABSTRACT

A sectioned bit line of an SRAM memory device, an SRAM memory device having a sectioned bit line, and associated systems and methods are described. In one illustrative implementation, the sectioned bit line may comprise a local bit line, a memory cell connected to the local bit line, and a pass gate coupled to the local bit line, wherein the pass gate is configured to be coupled to a global bit line. In other implementations, an SRAM memory device may be configured involving sectioned bit lines and a global bit line wherein the pass gates are configured to connect and isolate the sectioned bit line and the global bit line.

58 Claims, 20 Drawing Sheets

(56) References Cited

U.S. PATENT DOCUMENTS

| | | |
|---|---|---|
| 7,352,645 B2 | 4/2008 | Sforzin et al. |
| 7,376,027 B1 | 5/2008 | Chung et al. |
| 7,433,259 B2 | 10/2008 | Imai et al. |
| 7,561,462 B2 | 7/2009 | Hsu |
| 7,616,512 B2 | 11/2009 | Kim et al. |
| 7,663,942 B2 | 2/2010 | Kushida |
| 7,701,794 B2 | 4/2010 | Kajigaya |
| 7,719,909 B2 | 5/2010 | Chung et al. |
| 7,733,683 B2 | 6/2010 | Takashima et al. |
| 7,733,711 B2 | 6/2010 | Burnett et al. |
| 7,885,138 B2 | 2/2011 | Kim et al. |
| 7,933,160 B2 | 4/2011 | Kim |
| 7,952,946 B2 | 5/2011 | Kengeri et al. |
| 7,990,755 B2 | 8/2011 | Kim |
| 8,014,211 B2 | 9/2011 | Hess et al. |
| 8,116,149 B2 | 2/2012 | Chen et al. |
| 8,324,931 B2* | 12/2012 | Voogel et al. .................... 326/38 |
| 2004/0130926 A1 | 7/2004 | Nakase |
| 2005/0213366 A1* | 9/2005 | Kang ........................... 365/145 |
| 2006/0062061 A1 | 3/2006 | Suh et al. |
| 2008/0080259 A1 | 4/2008 | Buettner et al. |
| 2008/0180984 A1 | 7/2008 | Takashima et al. |
| 2009/0116285 A1* | 5/2009 | Youn ......................... 365/185.11 |
| 2009/0147561 A1 | 6/2009 | Sasaki et al. |
| 2009/0175113 A1 | 7/2009 | Deng et al. |
| 2009/0273961 A1 | 11/2009 | Ono et al. |
| 2010/0165749 A1 | 7/2010 | Wu et al. |
| 2010/0260002 A1 | 10/2010 | Chen et al. |
| 2010/0290305 A1 | 11/2010 | Rao et al. |
| 2011/0026348 A1 | 2/2011 | Narui |
| 2011/0188281 A1 | 8/2011 | Siau et al. |
| 2011/0188311 A1 | 8/2011 | Stiegler et al. |
| 2011/0199835 A1 | 8/2011 | Kengeri et al. |
| 2012/0314520 A1* | 12/2012 | Vogelsang et al. ............. 365/200 |

FOREIGN PATENT DOCUMENTS

| | | |
|---|---|---|
| JP | 2008171525 A | 7/2008 |
| JP | 2008198243 A | 8/2008 |
| JP | 2011034615 A | 2/2011 |
| KR | 20010065694 A | 7/2001 |

\* cited by examiner

Another embodiment of SBL and pass gates in SRAM

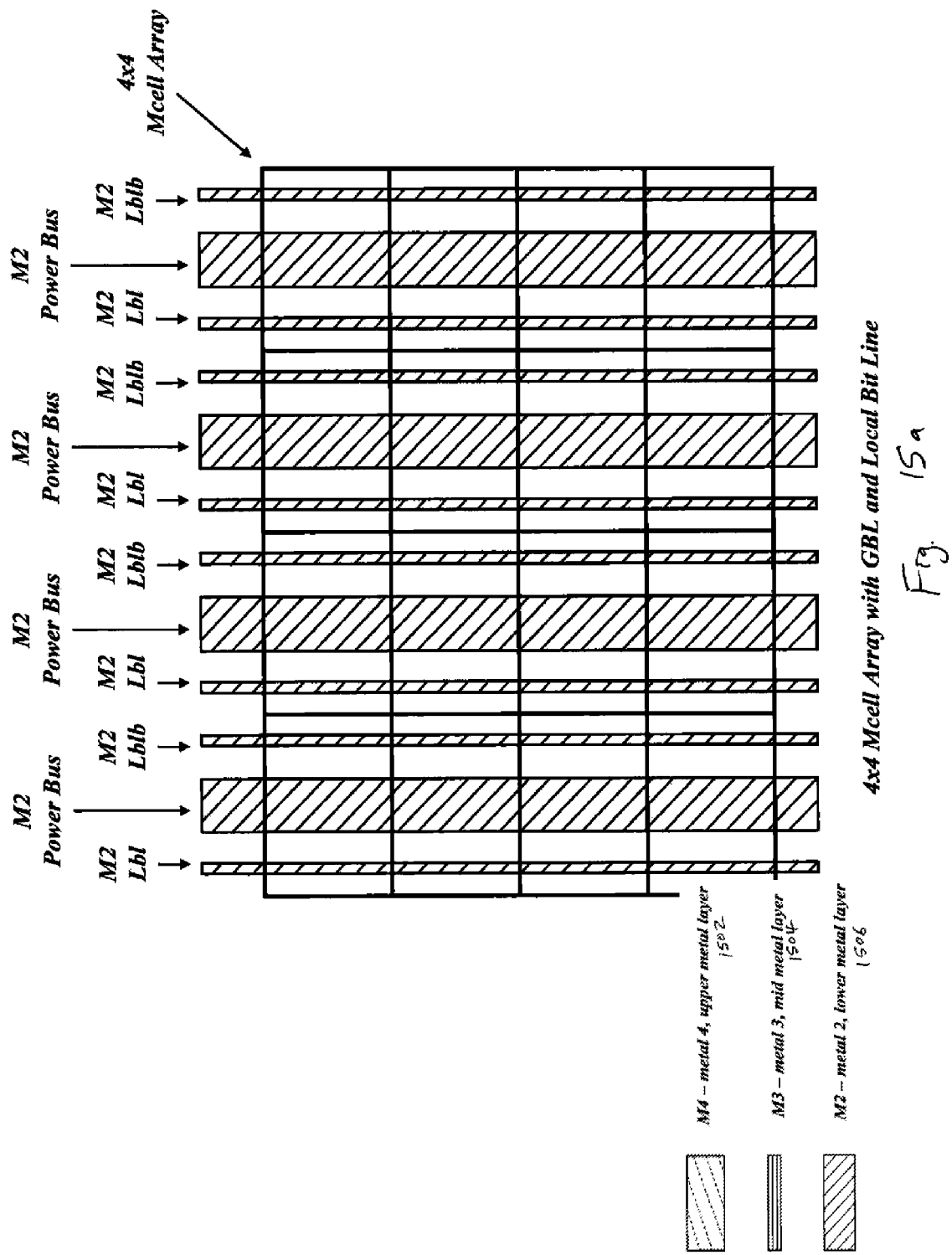

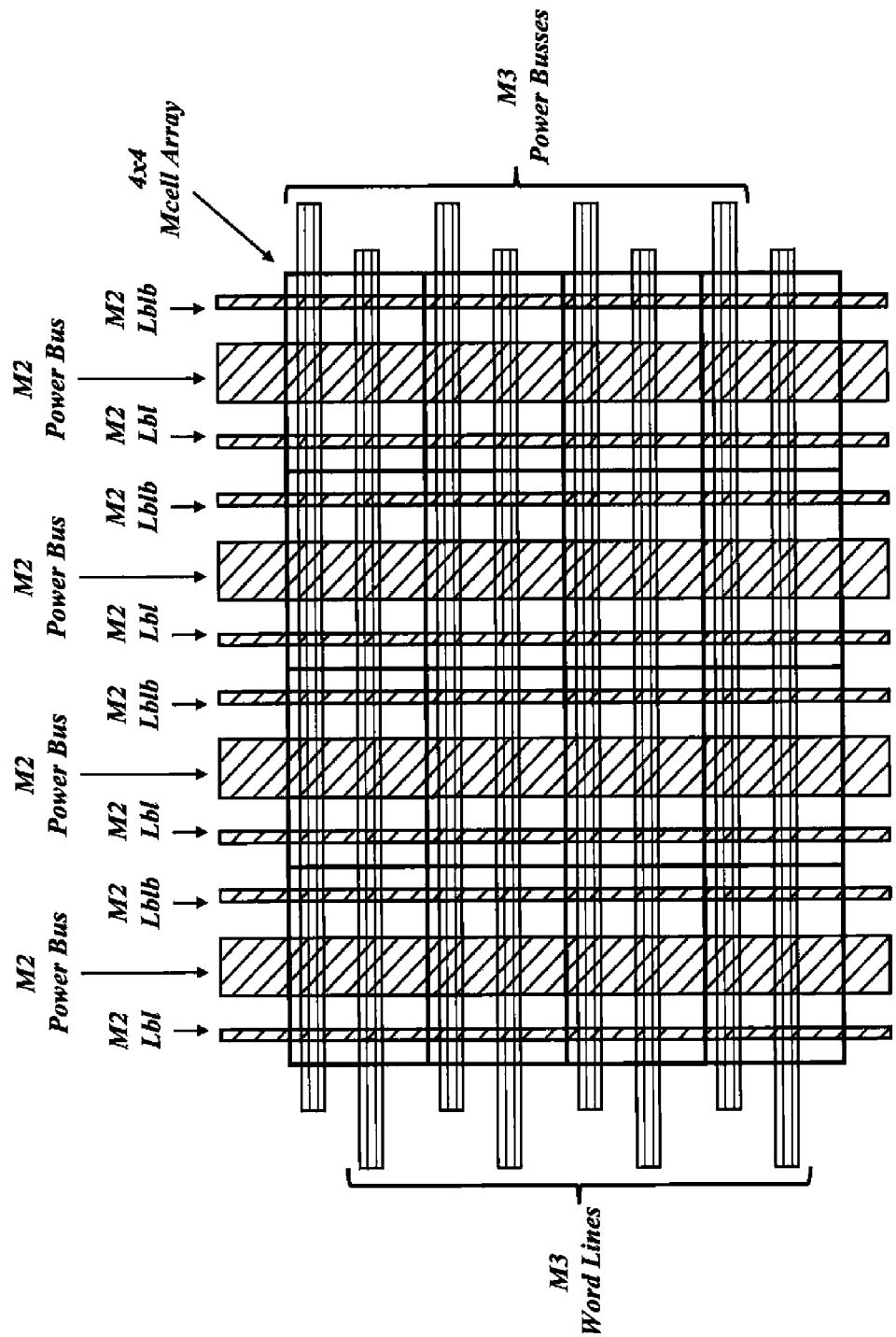

4x4 Mcell Array with GBL and Local Bit Line

4x4 Mcell Array with GBL and Local Bit Line

SYSTEMS AND METHODS OF SECTIONED BIT LINE MEMORY ARRAYS

BACKGROUND

1. Field

The innovations herein relate to static random access memory, and, more particularly, to systems and methods relating to SRAMs involving sectioned bit lines in memory arrays.

2. Description of Related Information

In high density static memory arrays, considerable effort is directed towards minimizing bit line capacitance. Bit line capacitance affects the speed of memory cell sensing and overall stability of memory cells. One way to reduce bit line capacitance is to reduce memory cell size, which is sometimes feasible though is subject to technological limitations. By reducing the memory cell size, the bit line is shortened but the memory cell active current is also reduced. Consequently, the overall performance of memory array may generally stay about the same. Performance may also be improved by reducing the number of memory cells on any given bit line. However, known practices in conventional SRAMs that maintain sensing speed typically entail reducing memory arrays density, which yields larger array area(s). Overall, such existing systems and methods suffer drawbacks relating to the failure to achieve smaller bit line capacitance in desired higher density memory arrays.

Other known systems and methods, such as with some DRAMs and folded bit line structures used in conventional DRAM, may include local bit line connected to gates of access transistors that pass representations of the local bit line onto a global bit line. However, such existing systems and methods may have one or more of a variety of drawback, such as being limited to having very small quantities of memory cells per bit line and thus very short bit lines due to their reduced sensing capability. Voltage swings associated with the bit lines of such systems and methods also tend to be large because of threshold voltage of gate. Further, such systems also suffer drawbacks related to the pass gates being gate-connected the local bit line, to passing an inverse of the signal on the local bit line, and/or to being pre-charged to high instead of low.

Moreover, DRAM implementations and folded bit line structures used in the conventional DRAM relate to a variety of disparate structural or operational issues and/or restrictions. For one, bit lines are typically charged to half Vcc in DRAM. Further, for example, folded bit line structures associated with conventional DRAMs are limited to two pairs of bit lines arranged on either side of the relevant sense amplifier. Also, due to the destructive nature of DRAM cell reading, various DRAM cells need to be sensed once a memory cell is turned on. Accordingly, there can only be one DRAM cell selected for every sense amplifier. Hence, as there can only be one memory cell selected on either the true bit line or the complement bit line, disparate issues associated with selecting memory cells on both at the same time are not present. Moreover, with DRAM, the word lines are not shared by the memory cells on the true bit line and complement bit line. In a hierarchical bit line DRAM, for example, when one memory cell is selected on the true local bit line, there can be no memory cell selected on the complement local bit line at the same time. And no issues related to selection of pass gates coupling the complement local bit lines and the complement global bit lines are present, either. The complement global bit line, e.g., is simply used as a sensing reference in some cases. As such, among the other issues noted above, no design considerations relating to selecting more than only the pass gate on the true local bit line are encountered/overcome.

In sum, as detailed in the innovations below, there is a need for the present systems and methods that may achieve smaller bit line capacitance, improved memory cell stability and/or higher density memory arrays.

BRIEF DESCRIPTION OF THE DRAWINGS

The accompanying drawings, which constitute a part of this specification, illustrate various implementations and features of the present inventions and, together with the description, help explain aspects of the innovations herein. In the drawings:

FIGS. 15A-15D are diagrams of illustrative SRAM cells including detail of exemplary layering of the SRAM structures according to disclosed implementations.

DETAILED DESCRIPTION OF ILLUSTRATIVE IMPLEMENTATIONS

Reference will now be made in detail to the innovations herein, examples of which are illustrated in the accompanying drawings. The implementations set forth in the following description do not represent all implementations consistent with the claimed invention. Instead, they are merely some examples consistent with certain aspects related to the present innovations. Wherever possible, the same reference numbers will be used throughout the drawings to refer to the same or like parts.

Systems and methods relating to a static random access memory (SRAM) including one or more sectioned bit lines (SBLs) are described. A plurality of SBLs may be provided and may all be in communication with a global bit line (GBL). Each sectioned bit line may also be in communication with one or more individual memory cells. Among other things, configurations consistent with the innovations herein may provide reduced bit line capacitance of the GBLs compared to prior configurations having the same number of memory cells.

Further, in some implementations, each of a plurality of memory cells that are associated with an SBL may connect onto true and complement local bit lines of the SBL. Each of the local bit lines may couple to a pass gate that may act as a conductor and isolator of the SBL to the GBL.

Figure 1A:
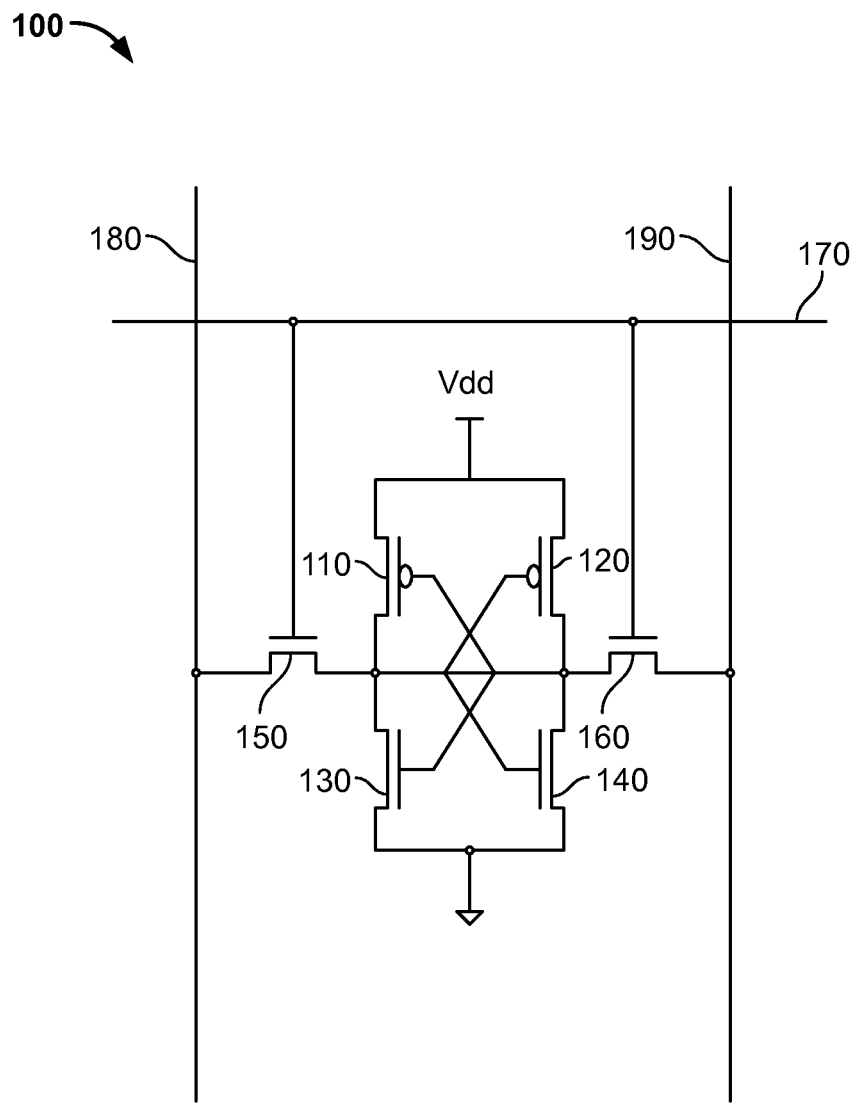
FIGS. 1A and 1B are diagrams of a 6-transistor (6T) memory cell and an 8-transistor (8T) memory cell, respectively, as may be used in embodiment(s) of the innovations herein.
Figure 1B:
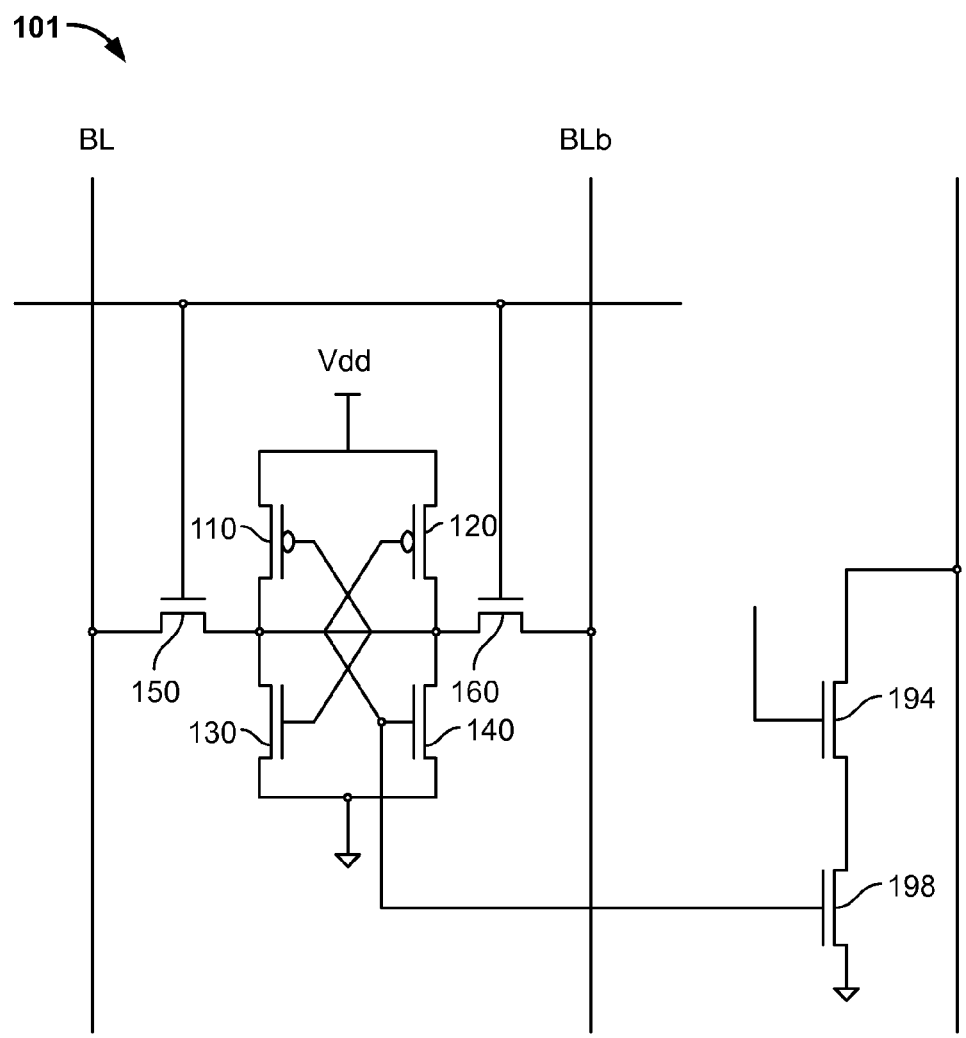

FIGS. 1A and 1B are diagrams of a 6-transistor (6T) memory cell and an 8-transistor (8T) memory cell, respectively, as may be used in embodiment(s) of the innovations herein. FIG. 1A is a diagram of a 6 transistor (6T) memory cell 100 that is an example of a memory cell that may be used in exemplary SRAMs herein. Other memory cells having different numbers of transistors, different configurations, and/or different components may be used, consistent with aspects of the present innovations. This example cell 100 may store a bit on four transistors 110, 120, 130, 140 that form two inverters. Access transistors 150, 160 may control access to the storage transistors 110, 120, 130, 140 during a read or write operation. A wordline 170 may control the access transistors 150, 160 and thereby connect the cell 100 to the bit line 180 and complement bit line 190. The bit lines 180, 190 may transfer data to and from the cell 100 during read and write operations. FIG. 1B is a diagram of an 8 transistor (8T) memory cell that is another example of a memory cell that may be used in exemplary SRAMs herein. The 8T memory cell 101 of FIG. 1B may comprise the 6 transistors of FIG. 1A, arranged in similar manner, as well as two additional transistors 194, 198 arranged in series between the read bit line and ground, wherein a gate of the first additional transistor 194 may be coupled to the read wordline and a gate of the second additional transistor 198 may be coupled to the storage transistor(s), e.g., to a gate of the fourth storage transistor 140.

Figure 1C:
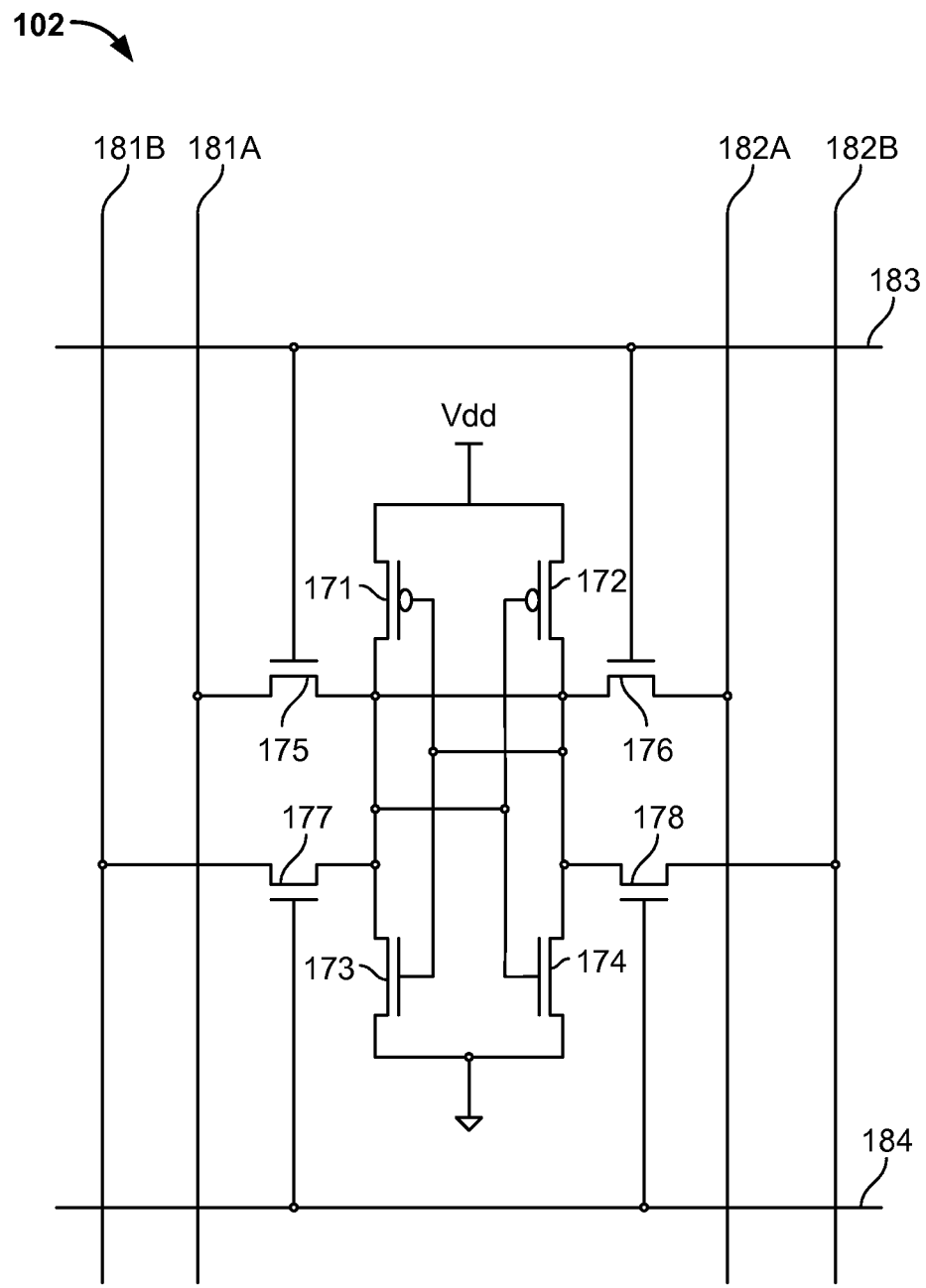
FIG. 1C is a diagram of a dual-port memory cell, as may be used in embodiment(s) of the innovations herein.

FIG. 1C is a diagram of a dual-port memory cell, as may be used in embodiment(s) of the innovations herein. This example cell 102 may store a bit on four transistors 171, 172, 173, 174 that form two inverters. Access transistors 175, 176, 177, 178 may control access to the storage transistors during a read or write operation. Wordline A 183 and wordline B 184 may control the access transistors and thereby connect the cell 102 to the bit lines, bit line A 181A and bit line B 181 B, and to the complement bit lines, complement bit line A 182A and complement bit line B 182B. The bit lines, in turn, transfer data to and from the cell 102 during read and write operations.

Figure 2:
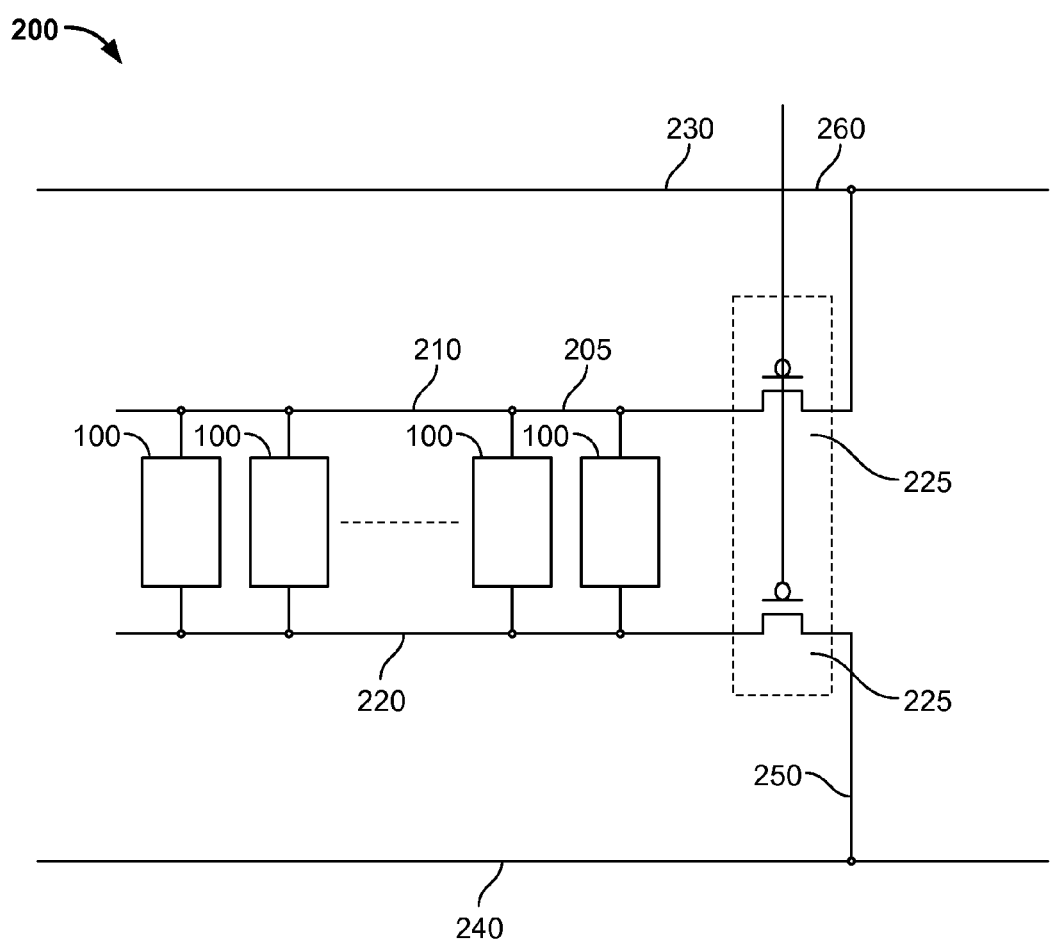
FIG. 2 is a diagram of an illustrative static random access memory (SRAM) including a sectioned bit line (SBL) and associated pass gates according to a disclosed implementation.

FIG. 2 is a diagram of a static random access memory (SRAM) 200 including a sectioned bit line (SBL) 205 according to an implementation of the innovations herein. Referring to FIG. 2, one or more memory cells 100 may connect to a LBL (local bit line) 210 and LBLb (complement local bit line) 220. In the example of FIG. 2, the memory cells are shown as 6T memory cells 100, though other memory cells may be utilized consistent with aspects of the innovations herein. Further, LBL 210 may connect to a pass gate transistor 215, and LBLb 220 may connect to a complement pass gate transistor 225. In some embodiments, the LBL 210 may connect to the drain of the pass gate transistor 215, and the LBLb 220 may connect to the drain of the complement pass gate transistor 225. The pass gate transistor 215 may connect to a GBL (global bit line) 230, and the complement pass gate transistor 225 may connect to a GBLb (complement global bit line) 240. A pass gate enable signal may control the pass gate transistor 215 and complement pass gate transistor 225 to allow communication between the LBL 210 and GBL 230 and between the LBLb 220 and GBLb 240 during read or write operations. In some embodiments, the true signal on the local bit lines 210, 220 may be passed to the global bit lines 230, 240, as opposed to a representation (such as an inverse) of the local bit line signal. In the illustrative implementation shown in FIG. 2, the pass gate enable line 260 controls the pair of pass gate transistors 250, coupling the local bit line to the global line when enabled. In operation, a desired memory cell 100 is selected and the enable signal 260 is enabled, to pass the desired read or write between the selected memory cell and the global bit line 230.

Moreover, in some implementations, the SBL 205 may be pre-charged to high before an operation, such as when the memory cells herein are configured in NMOS and utilize the memory cell design and characteristics of NMOS (e.g., electron mobility, etc.). In such implementations, the local bit line herein may be pre-charged to high to keep NMOS transistors in the active region. Accordingly, the present systems and methods may have one or more of the local bit lines be pre-charged to high to enable correspondingly improved operation of active NMOS transistors in the associated memory cell(s). Further, the present systems and methods may also be configured with bit lines pre-charged to high to enable such improved operation through the sense amplifier, e.g., in implementations that include NMOS voltage sense amplifiers.

Figure 3:
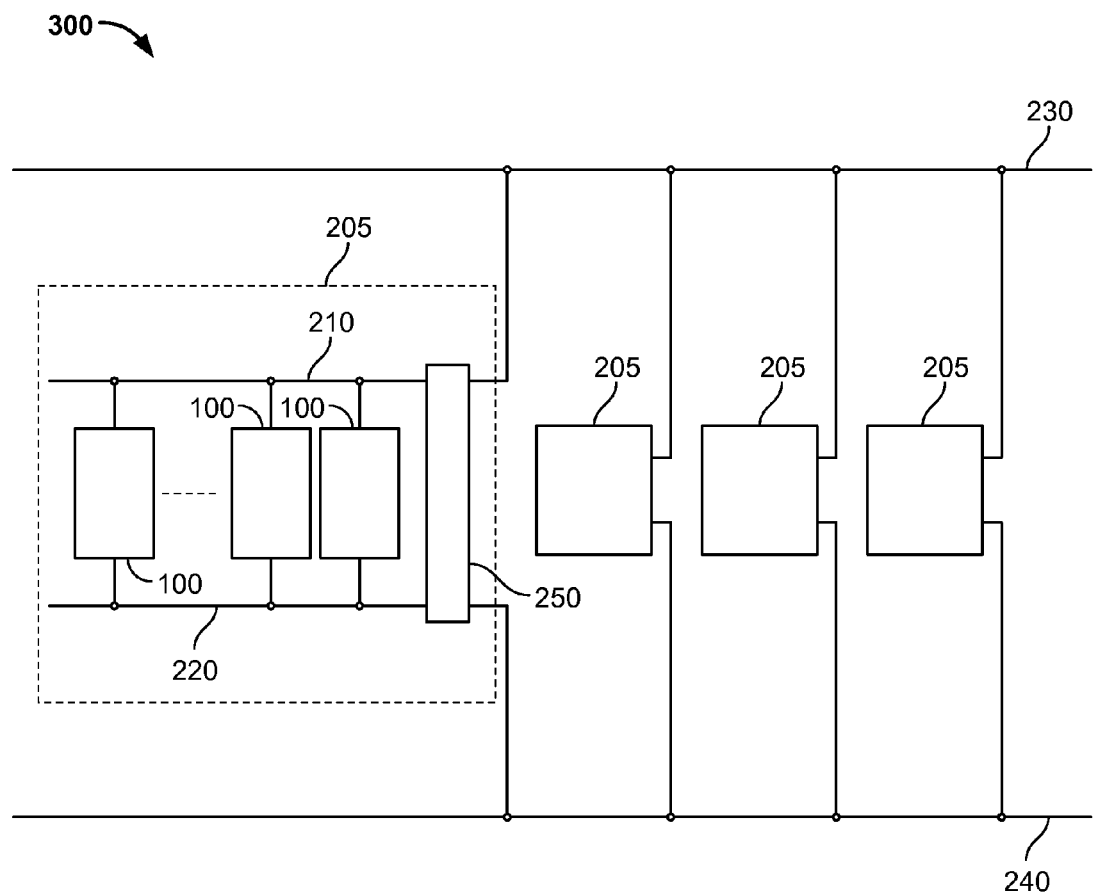
FIG. 3 is a diagram of an illustrative SRAM including a plurality of SBLs according to a disclosed implementation.

FIG. 3 is a diagram of an SRAM 300 including a plurality of SBLs 205 according to a disclosed implementation. In this example, four SBLs 205 are shown connected to a GBL 230 and GBLb 240, although other quantities of SBLs 205 may be provided in any given subset of SBLs. During operation, there may be only one SBL 205 connected to the GBL 230 and/or GBLb 240 at any time. As described in more detail below, such sectioned bit line architecture offers greater flexibility, reduced overall bit line capacitance, bit line length reduction as well as improved memory cell stability and power reduction.

Figure 4:
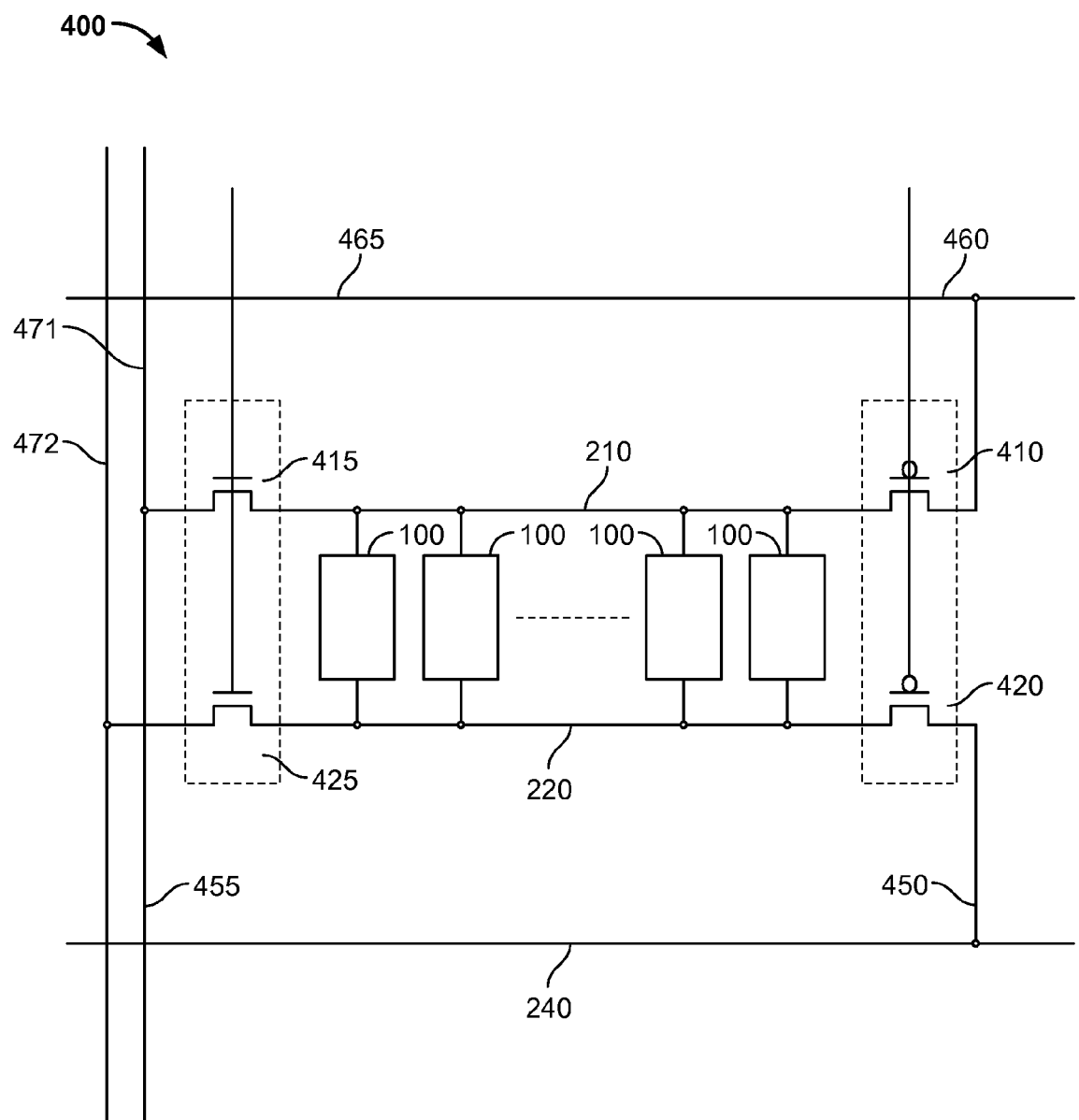
FIG. 4 is a diagram of an illustrative SRAM including an SBL and associated read and write pass gates according to a disclosed implementation.

FIG. 4 is a diagram of an SRAM 400 including an SBL 405 according to a disclosed implementation. Like the SBL 205 of FIG. 2, the SBL 405 of FIG. 4 may have a plurality of memory cells 100, an LBL 210, and an LBLb 220. In this embodiment, separate read pass gate circuitry 450 and write pass gate circuitry 455 are provided. Here, for example, illustrative read pass gate circuitry 450 may comprise two transistors 410, 420, such as PMOS transistors, with drains coupled to their respective local bit lines. Illustrative write pass gate circuitry 455 may comprise two transistors 415, 425, such as NMOS transistors, with drains similarly coupled to their respective local bit lines. Further, in some implementations, such separate read pass gate circuitry 450 and write pass gate circuitry 455 may speed up cycle time, such as when a write operation follows a read operation. LBL 210 may connect to a read pass gate transistor 410 and write pass gate transistor 415, and LBLb 220 may connect to a complement read pass gate transistor 420 and complement write pass gate transistor 425.

The read pass gate transistor 410 may connect to a GBL 230, and the complement read pass gate transistor 420 may connect to a GBLb 240. Read pass gate enable signals may control the read pass gate transistor 410 and the complement read pass gate transistor 420 to allow communication between the LBL 210 and GBL 230 and between the LBLb 220 and GBLb 240 during read operations. In this example, a single read pass gate enable signal 460 controls the pair of read pass gate transistors 450 with the same command. In this example, the read pass gate transistors 450 are PMOS devices, although other types of transistors may be used. For example, other implementations of read and write pass gate configurations consistent with the innovations herein include configurations where NMOS transistors are utilized for both read and write pass gates, configurations where PMOS transistors are utilized for both read and write pass gates, as well as configurations where both NMOS and PMOS transistors are utilized together for both read and write pass gates.

In this embodiment, local data lines 470 may also be provided. The write pass gate transistor 415 may connect to a first local data line 471, and the complement write pass gate transistor 425 may connect to a second local data line 472. In other embodiments, the read pass gate transistors 450 may connect to the local data lines 470, and the write pass gate transistors 455 may connect to the GBL 230 and GBLb 240. Write pass gate enable signals may control the write pass gate transistor 415 and the complement write pass gate transistor 425 to allow communication between the LBL 210 and first local data line 471 and between the LBLb 220 and second local data line 472 during write operations. In this example, a single write pass gate enable signal 465 controls the pair of write pass gate transistors 455 with the same command. In the illustrated implementation, the write pass gate transistors 455 may be NMOS devices, although other types of transistors may be used.

Figure 5:
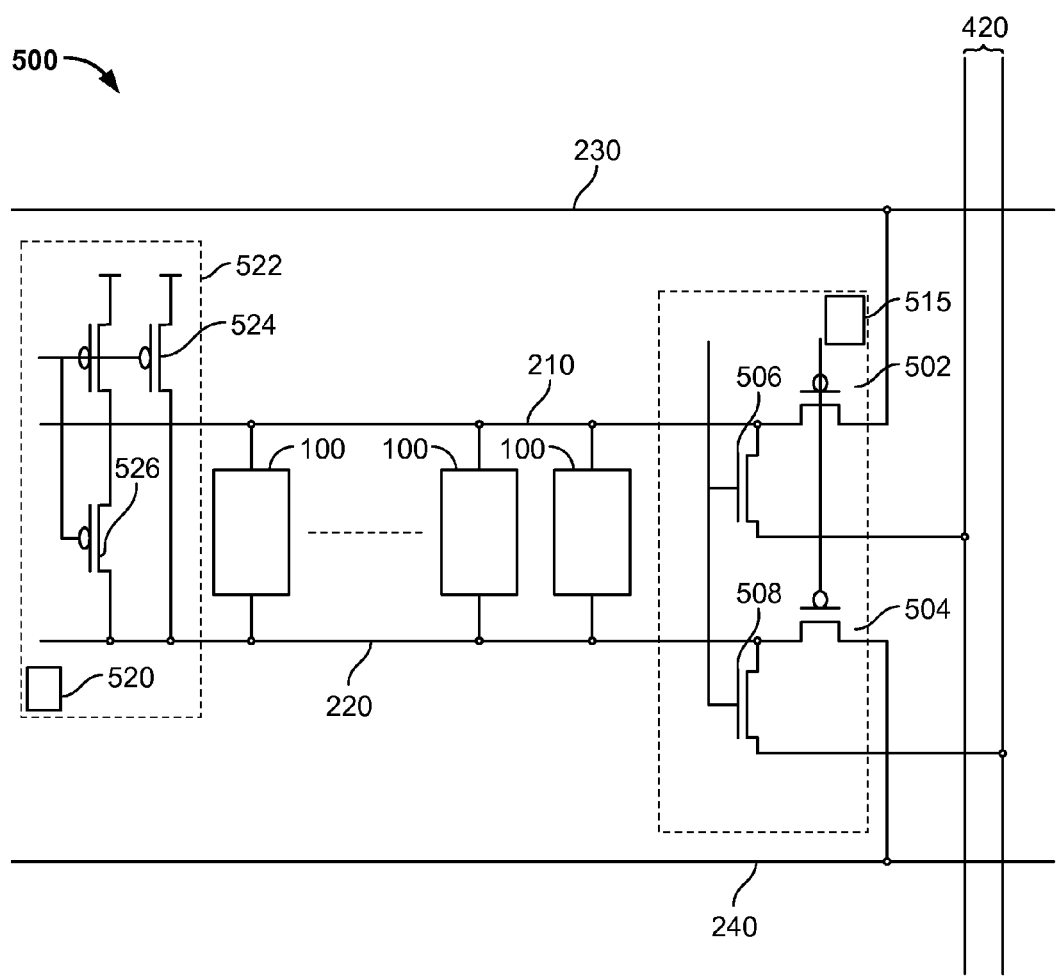
FIG. 5 is a diagram of an illustrative SRAM including an SBL with illustrative pass gate circuitry as well as illustrative equalization and/or write recovery circuitry according to a disclosed implementation.

FIG. 5 is a diagram of an exemplary SRAM including an SBL with illustrative pass gate circuitry as well as illustrative equalization and/or write recovery circuitry according to a disclosed implementation. The SRAM of FIG. 5 may include various pass gate (read and/or write) circuitry as set forth elsewhere herein. The pass gate circuitry illustrated in FIG. 5 has separate read and write enable controls, as discussed above, and has comparable bit line connections, as shown here in the context of a complementary pass gate cell 515 containing the various read/write pass gate transistors that couple the read/write pass gate enable signals to the local bit line and complement local bit line, respectively. In one illustrative implementation, a complementary pass gate cell 515 may comprise read pass gate circuitry including a first PMOS transistor 502 that couples the local bit line 210 to the global bit line 230 and a second PMOS transistor 504 that couples the complement local bit line 220 to the complement global bit line 240. Further, such complementary pass gate cell 515 may further comprise a first NMOS transistor 506 that couples the local bit line 210 to the local data line(s) 420 and a second NMOS transistor 508 that couples the complement local bit line 220 to the local data line(s) 420. Moreover, all of these coupling transistors 502, 504, 506, 508 may be configured such that the actual signals on the local lines are directly coupled to the associated global bit lines or local data lines via their source-to-drain connections, i.e., their actual, not complementary values, are provided as outputs. Referring to FIG. 5, equalization and/or write recovery circuitry 520 is also shown, consistent with aspects of the innovations herein. This circuitry 520 may be configured as bit line equalization circuitry, as write recovery circuitry, or as both. In the illustrated implementation, such circuitry 520 includes a first transistor 522 with drain coupled to the local bit line, a second transistor 524 with drain coupled to the local complement bit line, and a third transistor 526 with source coupled to the local bit line and drain coupled to the local complement bit line, wherein gates of the first, the second and the third transistors are coupled together to an equalization enable signal. Further, in some implementations, the first transistor 522, the second transistor 524, and the third transistor 526 may be PMOS transistors.

Here, as a function of such configurations, local bit line equalization may be achieved by way of equalizing the global bit line as long as the read pass gate of the SBL is on. Further, an advantage of such systems and methods is that chip surface area is reduced by removing the need for local equalization components. But, in some operations/implementations, other issues may exist, such as longer cycle time because the equalization cannot begin until after the sensing of the bit line is completed. In implementations herein, however, by including the bit line equalization into sectioned bit line, the bit line equalization may start earlier by shutting off read pass gate(s) without affecting unfinished sensing on the global bit line. Further, since the sectioned bit line is short, the associated local equalization response is correspondingly small. Accordingly, the area penalty is also small for such implementations, though the advantages of reducing cycle time/operation are more than enough to justify the extra area.

Figure 6:
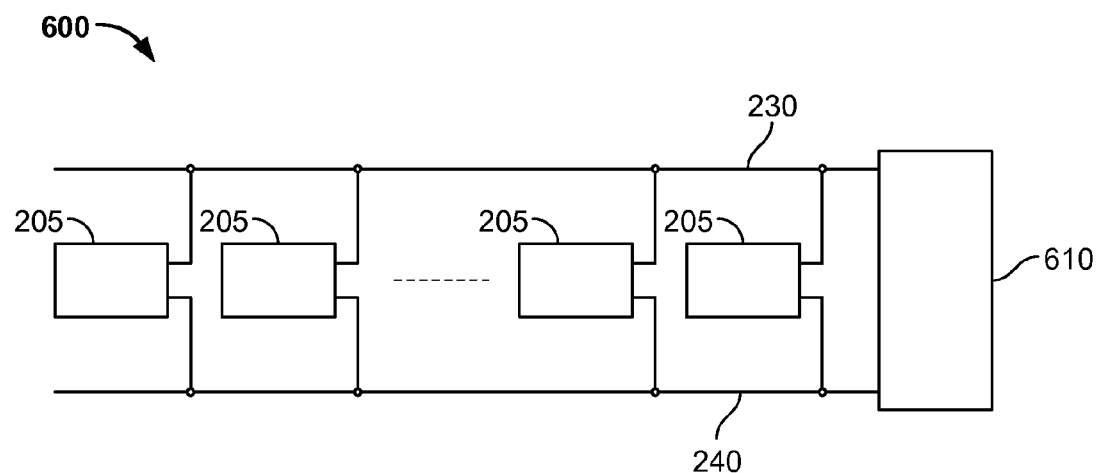
FIG. 6 is a diagram of an illustrative SRAM including a plurality of SBLs configured in a single row in the bit line direction with a sense amplifier according to a disclosed implementation.

FIG. 6 is a diagram of an SRAM 600 including a plurality of SBLs 205 configured in a row with a sense amplifier according to a disclosed implementation. In the illustrated implementation, the SRAM 600 has a configuration similar to the SRAM 300 of FIG. 3, but with a sense amplifier 610 shown. The sense amplifier 610 may detect and amplify signals on the GBL 230 and GBLb 240, for passing along to the circuitry accessing the SRAM. The plurality of SBLs 205 may be arranged in a single row in the bit line direction to form the GBL 230 and GBLb 240.

Figure 7:
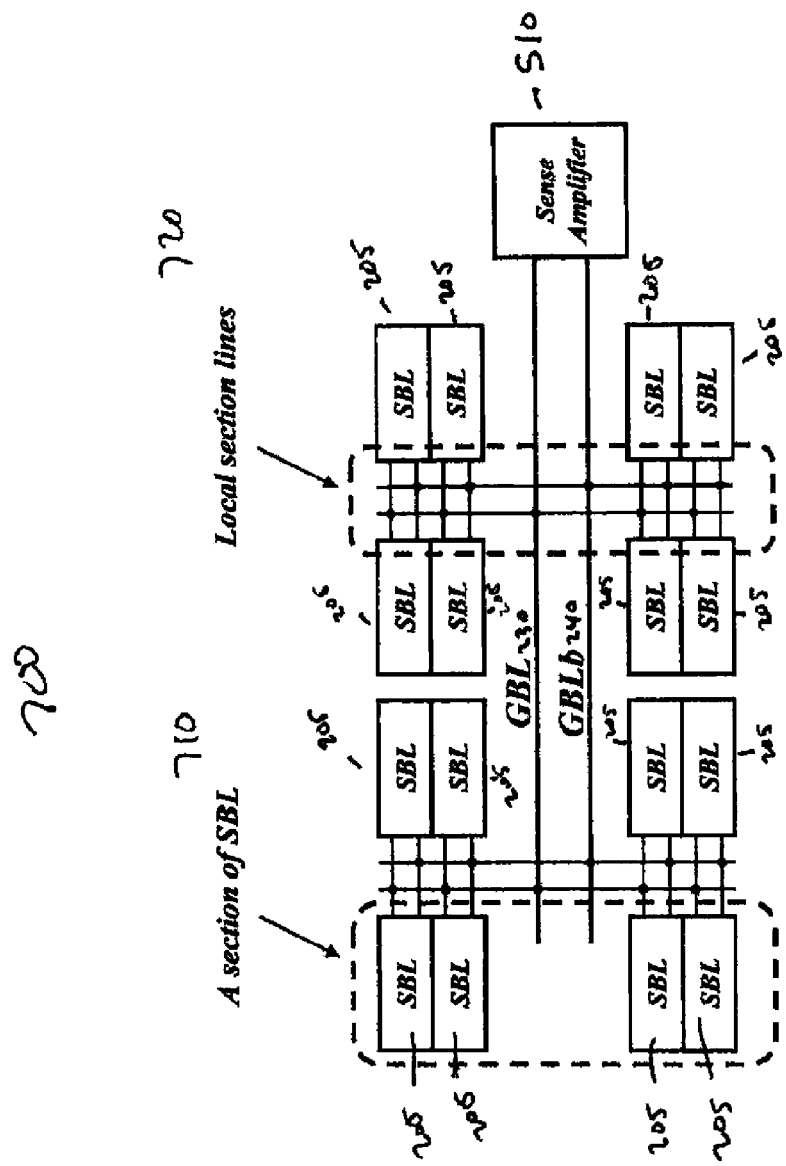
FIG. 7 is a diagram of an illustrative SRAM including a plurality of SBLs arranged in a matrix according to a disclosed implementation.

Bit line length in such SRAM circuits (i.e., overall or effective bit line length) may be given, approximately, as the sum of the SBL length and the GBL length. In order to reduce overall bit line length, implementations herein include SBLs arranged into matrices of multiple columns and rows that optimize the global bit line length. FIG. 7 is a diagram of an SRAM 700 including a plurality of SBLs 205 according to one such illustrative implementation of the innovations herein. Referring to FIG. 7, SBLs 205 may be arranged into a matrix of multiple columns and rows, which may reduce the overall bit line length otherwise present. In the example SRAM 700 of FIG. 7, the SRAM section shown is arranged into four columns of SBLs, although different arrangements are possible. Each of the columns may be regarded as a section 710. Thus, as used herein, connections between sections 710 and the global bit lines 230, 240 may be provided via local section lines 720.

FIG. 7 illustrates that global bit line may be shortened by implementing such plural SBLs arranged in multiple rows and columns to reduce global bit line length at the same time maintaining the memory array density. Further, such configurations entail additional column decoding required to achieve SBL matrix. Since there are many SBLs that are directly connected to the GBL, so there should be only one SBL that can be connected to the GBL at any time.

Further, consistent such configurations and the considerations and innovations set forth herein, the present implementations may comprise multiple bit lines sharing a sense amplifier with multiple SRAM cells selected. Further, such selected SRAM cells may be connected to both true and complement bit lines. In some such embodiments, the pass gates on true and complement local bit lines may be configured for selection at the same time. In other implementations, a word line may select multiple memory cells on multiple bit line pairs. Moreover, bit lines in various implementations herein may be charged to full Vcc of the SRAM.

Moreover, from a fabrication standpoint, SRAMs consistent with the innovations herein may be configured such that the global bit lines and/or control signals are formed in layers above or below the memory cells, i.e., on higher/lower level(s). See, for example, FIGS. 15A-15D. Such configurations provide better tracking in relation to the associated control signal(s), especially as against sense amplifier enable signal(s) and the SBL selection signals for SRAMs.

Figure 8:
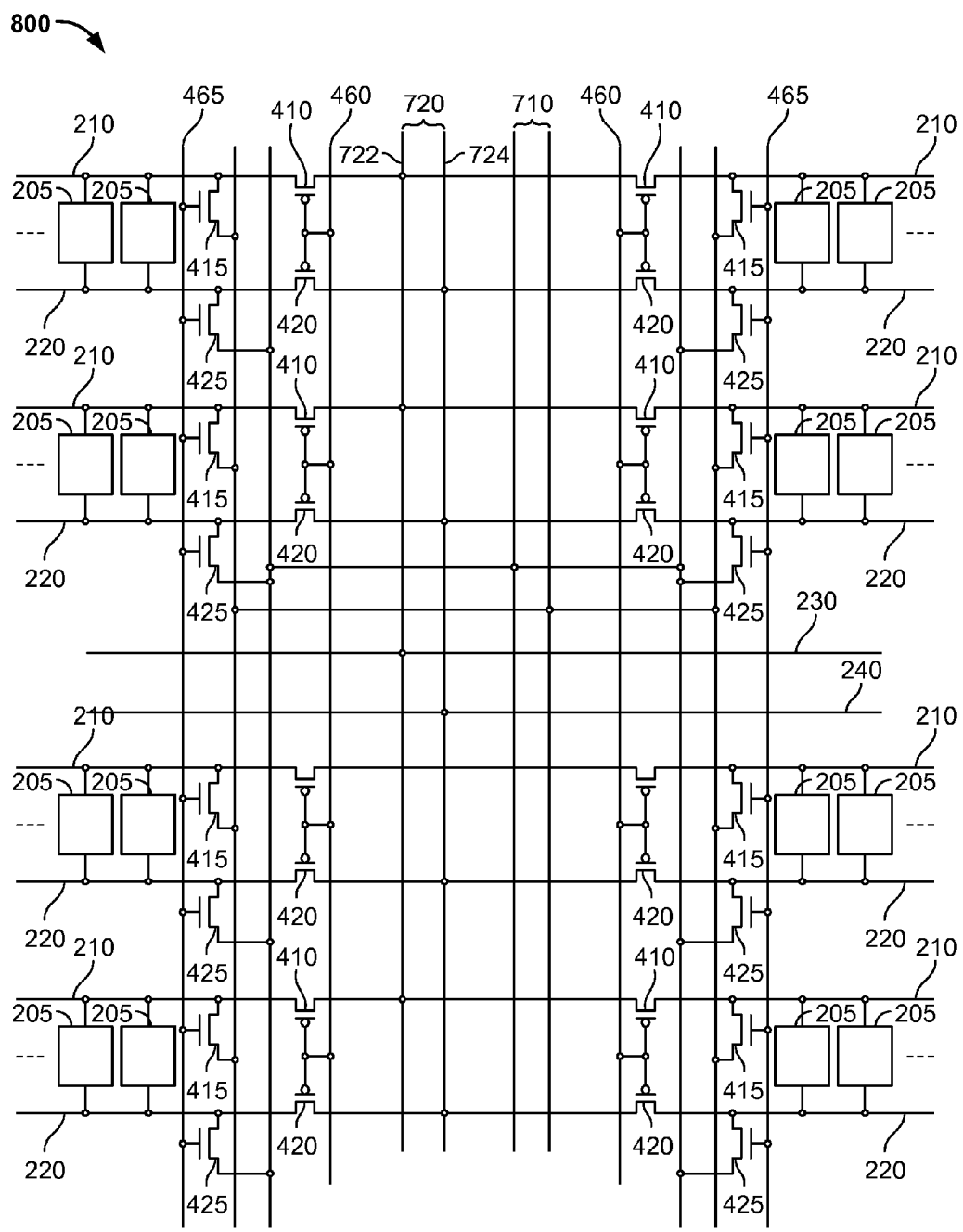
FIG. 8 is a diagram showing local connections of an illustrative matrix of a plurality of SBLs, such as that of FIG. 7, associated with exemplary SRAM memory according to a disclosed implementation.

FIG. 8 is a diagram of local connections of a plurality of SBLs 205 in an SRAM 800 according to an embodiment of the invention. FIG. 8 shows the local connections of the embodiment of FIG. 7 in greater detail. The SRAM may comprise a plurality of SBLs 205 which may be linked to LBLs 210 and LBLbs 220. In the illustrative implementation shown here, eight pairs of LBLs 210 and LBLbs 220 are provided. Each LBL 210 may have at least one associated read pass gate 410 and write pass gate 415, and each LBLb 220 may have at least one associated read pass gate 420 and write pass gate 425. As described above, the read pass gates 410, 420 may be controlled by read pass gate enable signals 460, and the write pass gates 415, 425 may be controlled by write pass gate enable signals 465.

As shown in FIG. 8, local section lines 720 may include LSL 722, LSLb 724, LDL 820, and LDLb 830. In this embodiment, LSL 722 and LSLb 724 may be used for write operations and may not be connected to the GBL 230 and GBLb 240. If they are not connected to the GBL 230 and GBLb 240, the LSL 722 and LSLb 724 do not directly contribute any loading to the GBL 230 and GBLb 240. Further, in some certain implementations, the LDL 820 and LDLb 830 may even be used for read operations. The pass gates 410, 415, 420, 425 associated with the SBLs 205 may be drawn in the bit line pitch of the SRAM 700 so multiple SBLs 205 may be arranged side by side.

Referring to FIG. 8, the local section lines 720 may be shorter and less capacitive than that of SBL since the length of lsl and lslb is only that of few memory cells. In one illustrative implementation, for example, systems may be configured with 8 SBLs connected to the lsl and lslb (see, e.g., FIG. 8), wherein the length of lsl or lslb is only about 4 bit line pitch width, which is very insignificant as compared to the length of local sectioned bit line or global bit line length.

Figure 10:
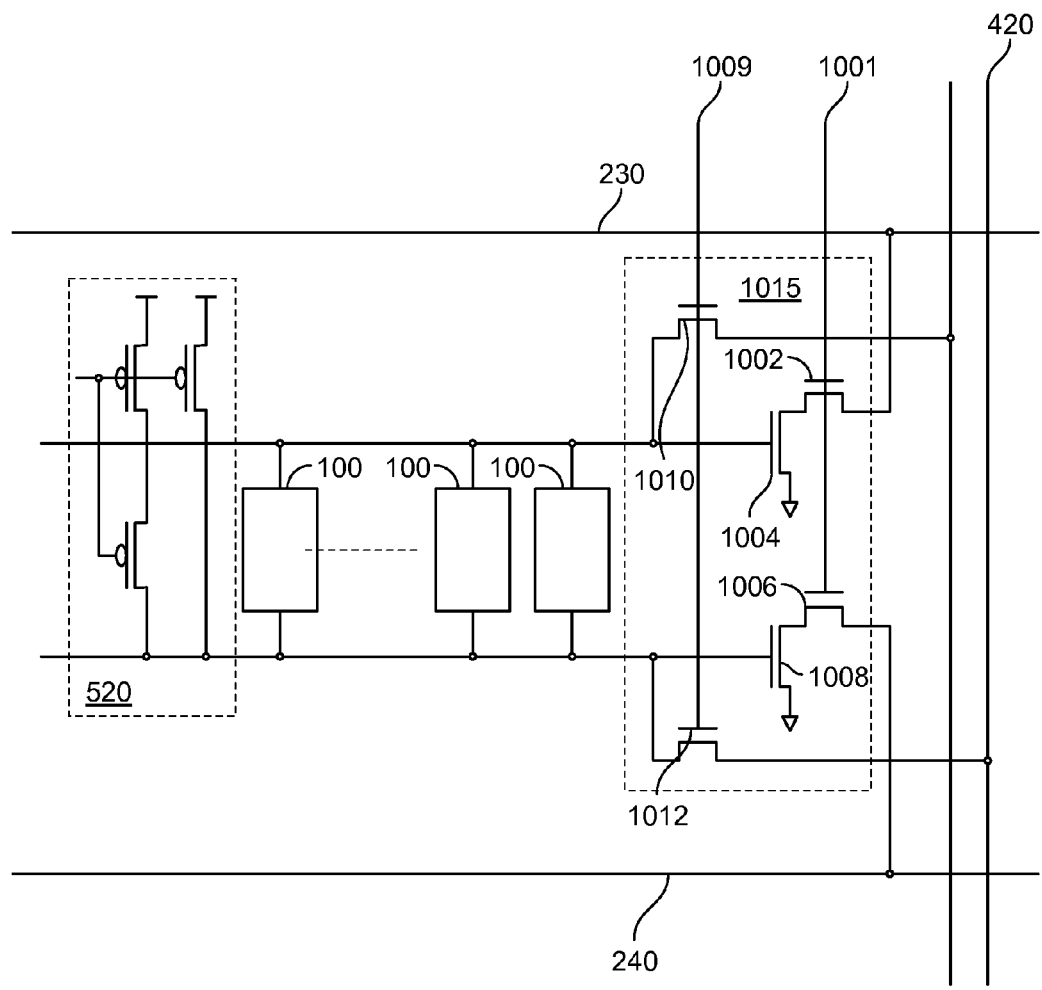
FIG. 10 is a diagram of an illustrative SRAM including an SBL with illustrative pass gate circuitry as well as illustrative equalization and/or write recovery circuitry according to a disclosed implementation.

With regard to implementations such as those shown in FIGS. 7 and 8, a simplified view of sectioned bit line of FIG. 7 is shown in FIG. 10, which is explained in more detail further below.

Figure 9A:
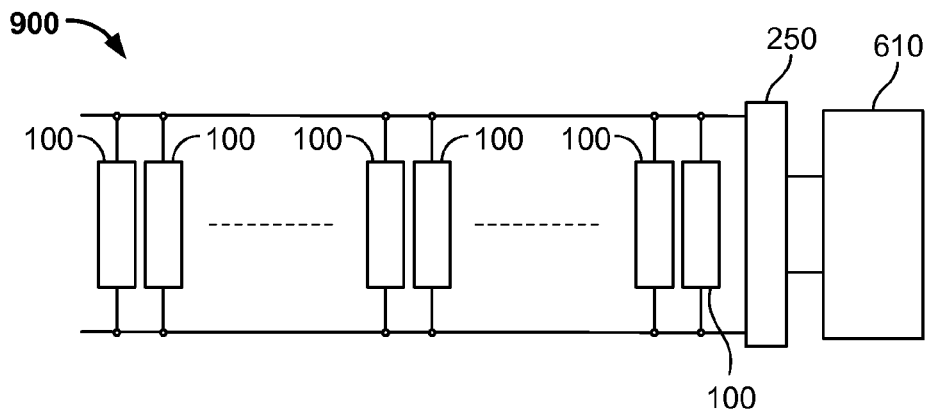
FIG. 9A is a diagram of an SRAM without SBLs.
Figure 9B:
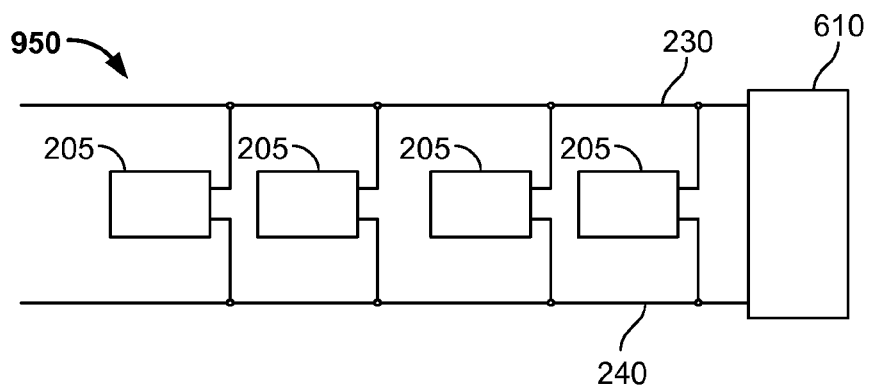
FIG. 9B is a diagram of an illustrative SRAM including a plurality of SBLs according to a disclosed implementation.
Figure 9C:
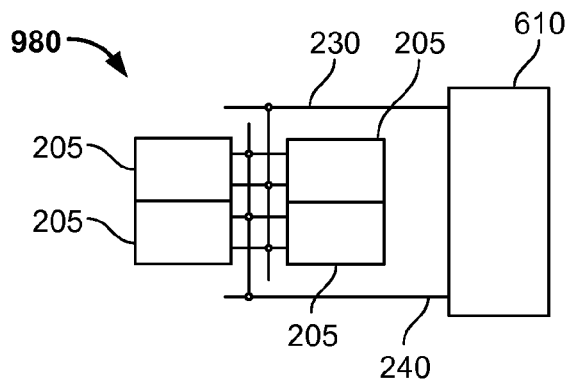
FIG. 9C is a diagram of an illustrative SRAM including a plurality of SBLs according to a disclosed implementation.

FIGS. 9A-9C present a comparison of a conventional SRAM bit line scheme (FIG. 9A) with two SBL configurations (FIGS. 9B-9C). A conventional SRAM 900 with a plurality of memory cells 100 and bit lines 900, 910 is shown in FIG. 9A. For example, the SRAM 900 may have N memory cells 100. FIG. 9B is a diagram of an SRAM 950 including a plurality of SBLs 205 according to an embodiment of the invention. The SRAM 950 may also have N memory cells 100, but the memory cells 100 may be arranged within four SBLs 205, in this example. The memory cells 100 may be divided among other numbers of SBLs 205 in other embodiments. Global bit line length for the SRAM 900 without local bit lines and the SRAM 950 comprising local bit lines may be similar. However, the total junction capacitance of the SRAM 950 comprising local bit lines and four SBLs 205 may be approximately one quarter of the junction capacitance of the SRAM 900 without local bit lines. The global bit line length and capacitance may be further reduced by arranging the four SBLs 205 into two rows and two columns, as shown by the SRAM 980 of FIG. 9C. The global bit line length of SRAM 980 may be approximately half that of SRAM 950, and the global bit line length of SRAM 980 may be approximately the same as that of an SBL 205. The sectioned bit line architecture may offer many ways to arrange components to affect speed and power consumption.

FIG. 10 is a diagram of an illustrative SRAM including an SBL with illustrative pass gate circuitry as well as illustrative equalization and/or write recovery circuitry according to a disclosed implementation. Referring to FIG. 10, exemplary SRAM circuitry is disclosed, which may include pass gate circuitry having separate read and write enable controls, as discussed above, and may have comparable bit line connections. Further, various pass gate (read and/or write) or other circuitry may be included, as set forth elsewhere herein. For example, the SRAM circuitry may include equalization and/or write recovery circuitry 520, such as in FIG. 5, consistent with aspects of the innovations herein. This circuitry 520 may be configured as bit line equalization circuitry, as write recovery circuitry, or as both. In the illustrated implementation, such circuitry 520 may includes a first transistor with drain coupled to the local bit line, a second transistor with drain coupled to the local complement bit line, and a third transistor with source coupled to the local bit line and drain coupled to the local complement bit line, wherein gates of the first, the second and the third transistors are coupled together to an equalization enable signal. Further, in some implementations, these transistors may be PMOS transistors. Moreover, with regard to the pass gate circuitry, FIG. 10 illustrates another exemplary implementation of a complementary pass gate cell 1015 containing the various read/write pass gate transistors that couple the read/write pass gate enable signals to the local bit line and complement local bit line, respectively.

In one illustrative implementation, such complementary pass gate cell 1015 may comprise read pass gate circuitry including transistor pairs between the local bit lines and the global bit lines, such pairs including first transistors 1004, 1008 with gates connected to the local bit line and complement local bit line, respectively, and sources coupled to drains of second transistors 1002, 1006 that have gates coupled to the read pass enable signal and sources connected to the global bit line and complement global bit line, respectively.

Further, such complementary pass gate cell 1015 may further comprise a first NMOS transistor 1010 that couples the local bit line 210 to the local data line(s) 420 and a second NMOS transistor 1012 that couples the complement local bit line 220 to the local data line(s) 420. Moreover, these coupling transistors or these combinations of coupling transistors may be configured such that the actual signals on the local lines are directly coupled to the associated global bit lines or local data lines via their source-to-drain connections, i.e., their actual, not complementary, values are provided as outputs.

Further, e.g. in implementations such as that of FIG. 8, multiple level column decoding may be utilized to provide proper connection to the GBL, which may be configured in the same direction as local bit lines. Additionally, the local sense amplifier enable signal and/or the local data driver enable signal, with regard to the memory cells layout, may also be configured in the same direction as local bit line. Indeed, in some implementations, the local sense amplifier enable and local data driver enable are part of Y (column) decoding of the global bit line. Moreover, such SRAMs and associated method herein may be implemented such that the local select (LS) is a function of X decoding. Further, in some implementations, local select (LS) and local pass gate enable signals (Rpb and Wp) may be configured in the word line direction.

Figure 11:
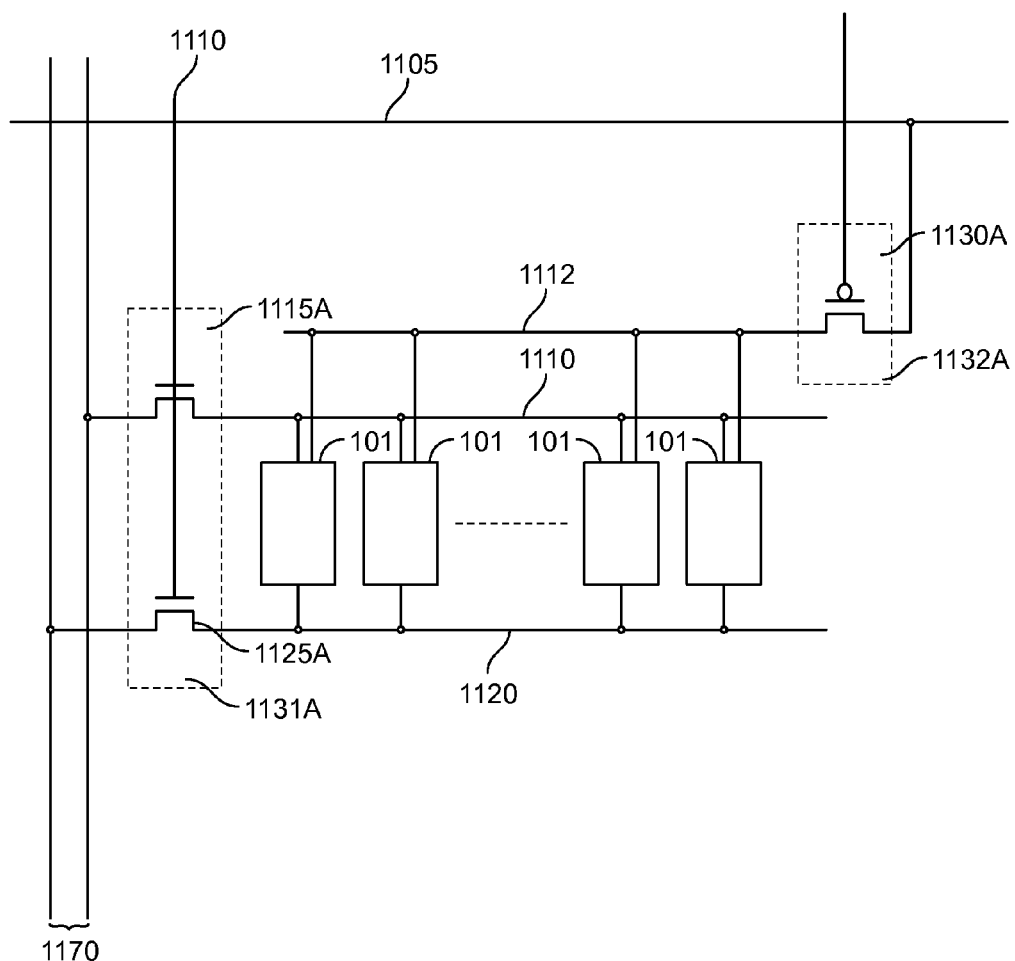
FIGS. 11 and 12 are diagrams of illustrative SRAMs including SBLs, 8T memory cells and associated read and write pass gates according to disclosed implementations.
Figure 12:
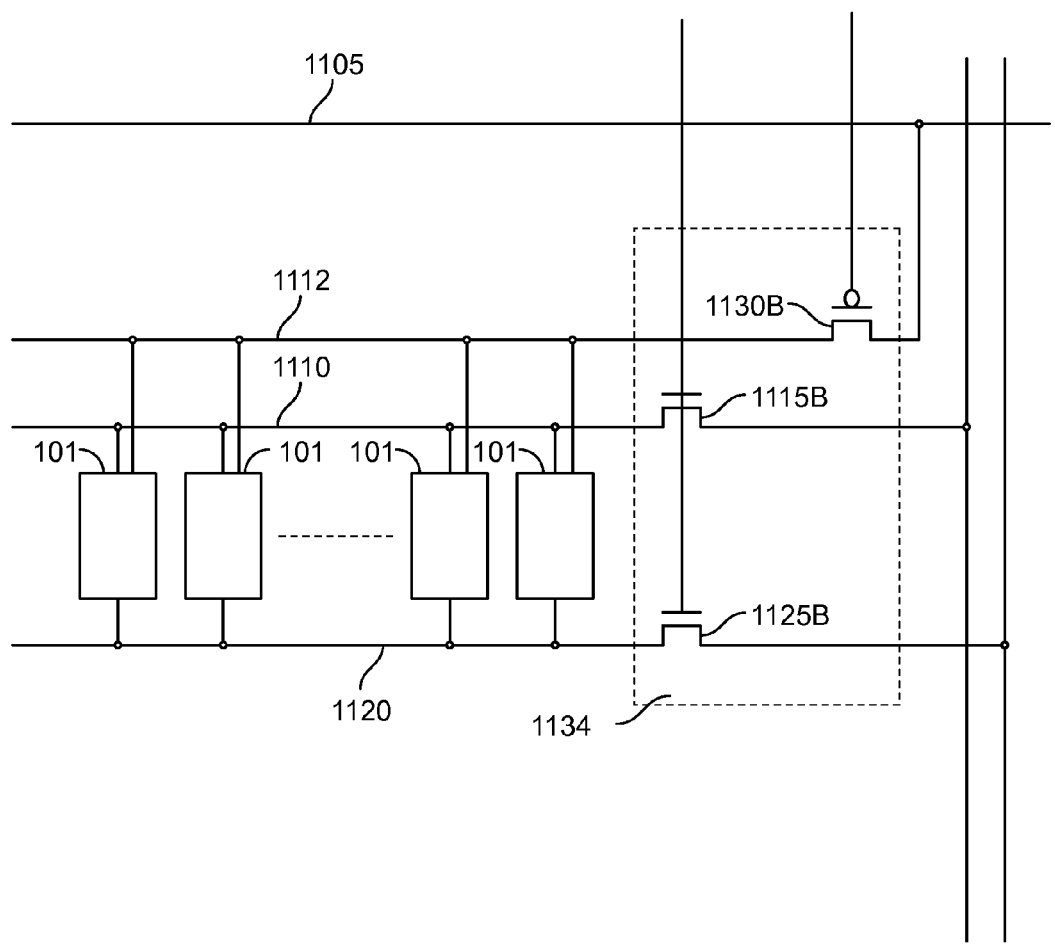

FIGS. 11 and 12 are diagrams of illustrative SRAMs including SBLs, 8T memory cells and associated read and write pass gates according to disclosed implementations. As with the previous implementations, the SBLs of FIGS. 11 and 12 may have a plurality of 8T memory cells 101, local data lines 1170, as well as local and global bit lines. The implementations of FIGS. 11 and 12 include a write local bit line 1110, a read local bit line 1112 and a complement write local bit line 1120. In the embodiment of FIG. 11, separate read pass gate circuitry 1132A and write pass gate circuitry 1131A are provided. Here, for example, illustrative write pass gate circuitry 1131A may comprise two transistors 1115A, 1125A, such as NMOS transistors, with drains coupled to their respective local bit lines, write local bit line 1110 and complement write local bit line 1120. Illustrative read pass gate circuitry 1132A may comprise a transistor 1130A, such as PMOS transistor, with drain coupled to its respective read local bit line 1112. Again, in some implementations, such separate read pass gate circuitry and write pass gate circuitry may speed up cycle time, such as when a write operation follows a read operation.

Referring to FIG. 11, the read pass gate transistor 1130A may connect to a GBL 1105. Further, a read pass gate enable signal 1160 may control the read pass gate transistor(s) to allow communication between the local and global bit lines during read operations. In this example, the read pass gate transistor 1130A may be a PMOS device, although other types of transistors may be used.

In this embodiment, local data lines 1170 may also be provided. A first write pass gate transistor 1115A may connect to a first local data line, and the complement write pass gate transistor 1125A may connect to a second local data line. In this example, a single write pass gate enable signal 1140 may control the pair of write pass gate transistors with the same command. In the illustrated implementation, the write pass gate transistors 1115A, 1125A may be NMOS devices, although other types of transistors may be used.

In the embodiment of FIG. 12, an integrated and/or "complementary" pass gate circuit 1134 may be provided. Here, for example, the read/write transistors and control functionality set forth above may be integrated into a structurally, functionally and/or electrically unitary module or component. In particular, control and signals provided to such integrated circuitry may be configured as complementary circuitry to provide greater efficiency, decreased size, reduction in cost, or the like.

Overall, the decision of which such pass gate structures to use may be a determination performed as a function of structural and/or layout considerations, such as issues of separation of the read bit line from the write bit line, need for better memory cell stabilization, higher speed, and/or lower power, among other desires.

Figure 13:
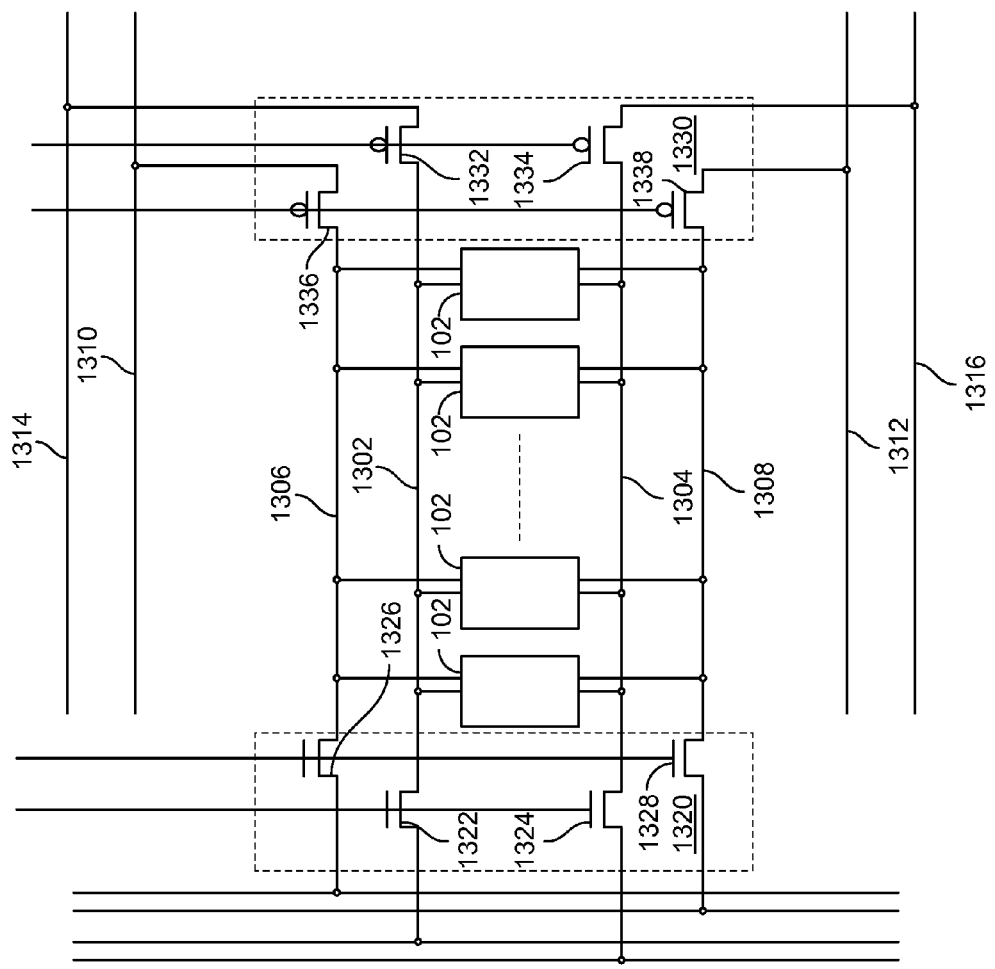
FIGS. 13 and 14 are diagrams of illustrative SRAMs including SBLs, dual-port memory cells and associated read and write pass gates according to disclosed implementations.
Figure 14:
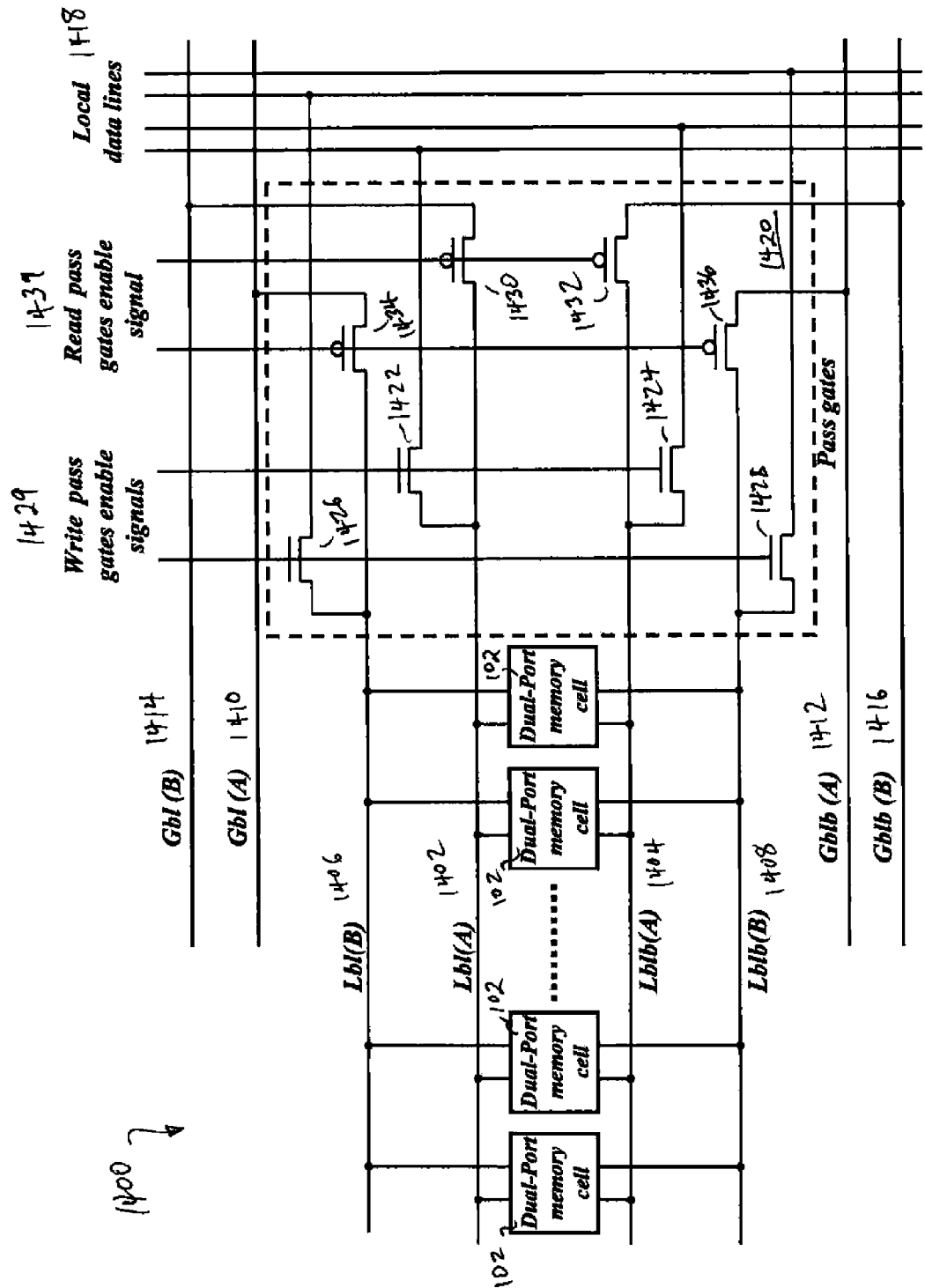
Figure 15C:
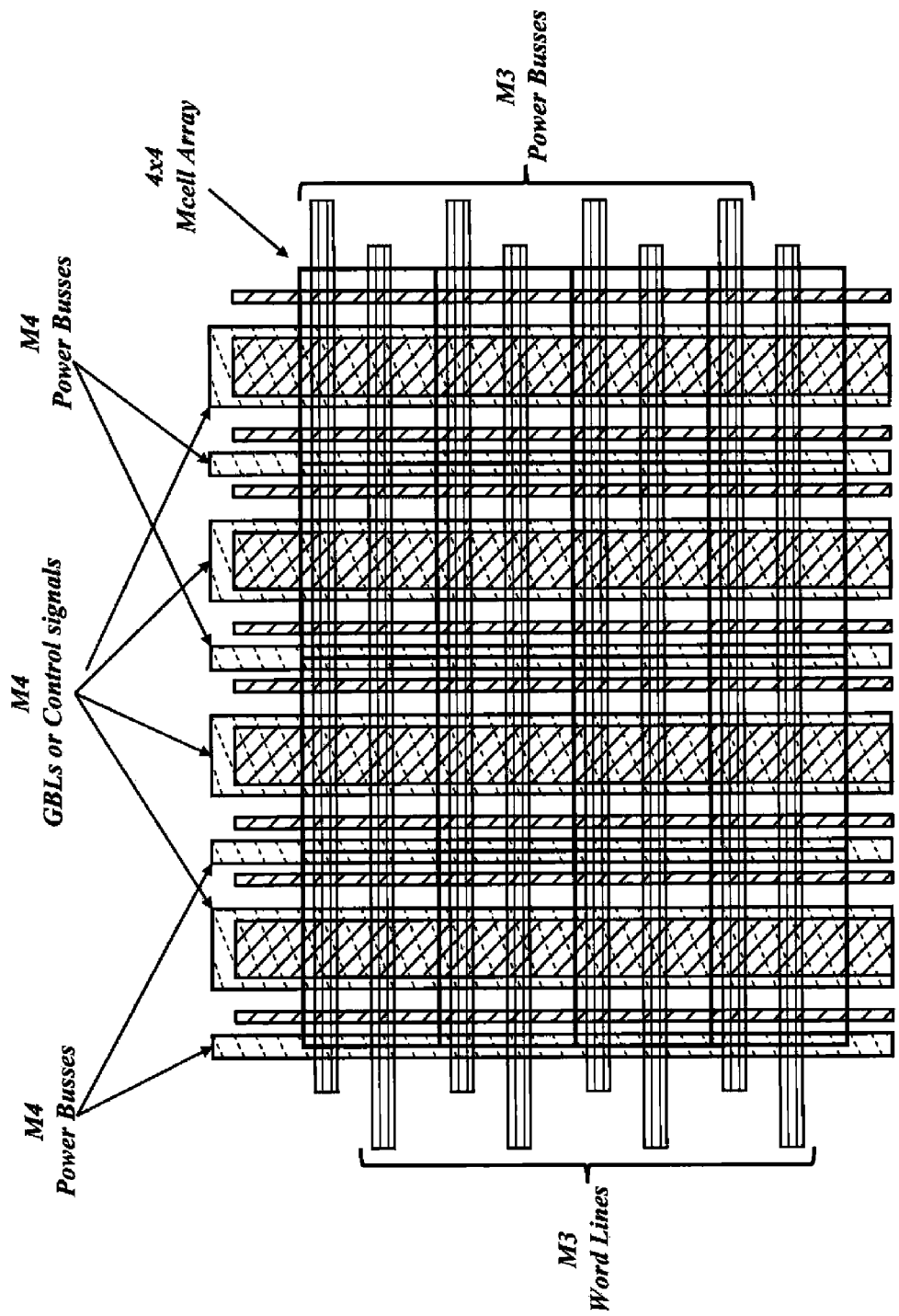
Figure 15D:
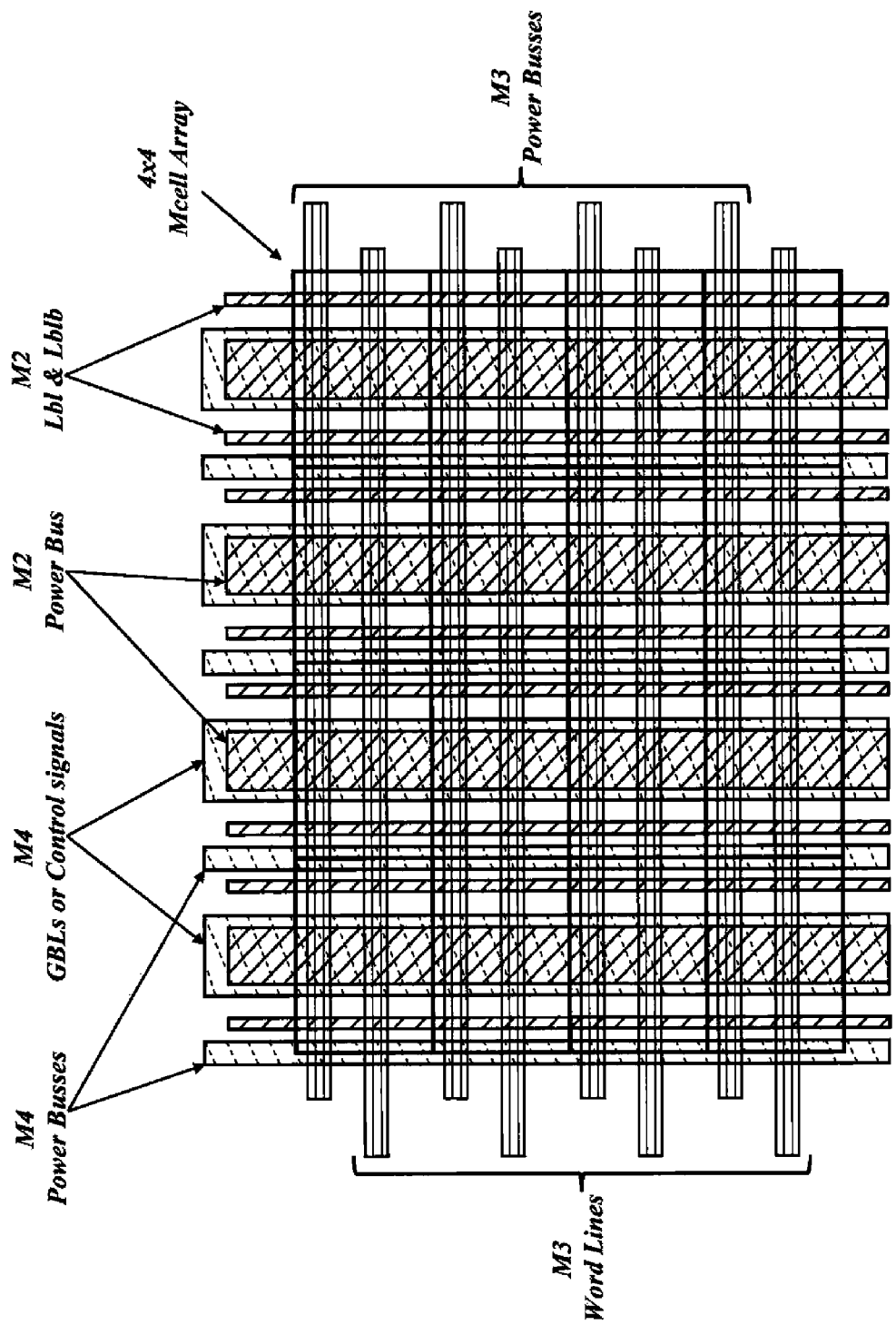

FIGS. 13 and 14 are diagrams of illustrative SRAMs including SBLs, dual-port memory cells and associated read and write pass gates according to disclosed implementations. Referring to FIG. 13, a first implementation involving dual-port memory cells 102 is shown. Here, each section bit line may include local bit line A and its complement 1302, 1304 as well as local bit line B and its complement 1306, 1308 coupled to the memory cells 102. Further, write pass gate circuitry 1320 may be connected between the local bit lines and the local data lines 1318 and read pass gate circuitry may be connected between the local bit lines and the global bit lines (global bit line A and its complement 1310, 1312 and global bit line B and its complement 1314, 1316).

Write pass gate circuitry 1320 may include transistors/components coupled to a first write pass gate signal 1329 including a first coupling transistor 1322 connected between local bit line A 1302 and the local data line 1318 and a second coupling transistor 1324 connected between the complement local bit line A 1304 and the local data line 1318. Write pass gate circuitry may also include transistors/components coupled to a second write pass gate signal 1329 including a first coupling transistor 1326 connected between local bit line B 1306 and the local data line 1318 and a second coupling transistor 1328 connected between the complement local bit line B 1308 and the local data line 1318. In some embodiments, such coupling transistors 1322,1324, 1326, 1328 may be NMOS transistors. Further, in certain implementations, such coupling transistors may be connected to the local bit lines via their drains, to enable passing of true (not inverse) local bit line values to the global bit lines.

Read pass gate circuitry 1330 may include transistors/components coupled to a first read pass gate signal 1339 including a first coupling transistor 1332 connected between local bit line A 1302 and global bit line B 1314 and a second coupling transistor 1334 connected between the complement local bit line A 1304 and the complement global bit line B 1316. Read pass gate circuitry 1330 may also include transistors/components coupled to a second read pass gate signal 1339 including a first coupling transistor 1336 connected between local bit line B 1306 and global bit line A 1310 and a second coupling transistor 1338 connected between the complement local bit line B 1308 and global bit line A 1312. In some embodiments, such coupling transistors 1332,1334, 1336, 1338 may be PMOS transistors. Further, in certain implementations, such coupling transistors may be connected to the local bit lines via their drains, to enable passing of true (not inverse) local bit line values to the global bit lines.

Referring to FIG. 14, a second implementation involving dual-port memory cells 102 is shown. Here, each section bit line may include local bit line A and its complement 1402, 1404 as well as local bit line B and its complement 1406, 1408 coupled to the memory cells 102. Further, a complementary pass gate cell 1420 including write pass gate circuitry and read pass gate circuitry may be connected between the local bit lines and the global bit lines 1410, 1412, 1414, 1416 or the local data lines 1418.

Within the complementary pass gate cell 1420, write pass gate circuitry may include transistors/components coupled to a first of the write pass gate signals 1429 including a first coupling transistor 1422 connected between local bit line A 1402 and the local data line 1418 and a second coupling transistor 1424 connected between the complement local bit line A 1404 and the local data line 1418. Such write pass gate circuitry may also include transistors/components coupled to a second of the write pass gate signals 1429 including a first coupling transistor 1426 connected between local bit line B 1406 and the local data line 1418 and a second coupling transistor 1428 connected between the complement local bit line B 1408 and the local data line 1418. In some embodiments, such coupling transistors 1422,1424, 1426, 1428 may be NMOS transistors. Further, in certain implementations, such coupling transistors may be connected to the local bit lines via their drains, to enable passing of true (not inverse) local bit line values to the global bit lines.

Also within the complementary pass gate cell 1420, read pass gate circuitry may include transistors/components coupled to a first of the read pass gate signals 1439 including a first coupling transistor 1430 connected between local bit line A 1402 and global bit line B 1414 and a second coupling transistor 1432 connected between the complement local bit line A 1404 and the complement global bit line B 1416. Such read pass gate circuitry may also include transistors/components coupled to a second of the read pass gate signals 1439 including a first coupling transistor 1434 connected between local bit line B 1406 and global bit line A 1410 and a second coupling transistor 1436 connected between the complement local bit line B 1408 and global bit line A 1412. In some embodiments, such coupling transistors 1430,1432, 1434, 1436 may be PMOS transistors. Further, in certain implementations, such coupling transistors may be connected to the local bit lines via their drains, to enable passing of true (not inverse) local bit line values to the global bit lines.

Additionally, from a structural standpoint, SRAMs consistent with the innovations herein may be configured such that the global bit lines and/or control signal lines are formed in layers above or below the memory cells, i.e., on higher/lower level(s). Here, for example, FIGS. 15A-15D illustrate various illustrative implementations wherein the local bit lines and/or the global bit lines or control signal lines are formed above or below the memory cell array. As shown in the illustrated embodiments, local bit lines and power buses may be formed in metal 2 1506, word lines and power buses may be formed in metal 3 1504, and global bit lines, control signal lines and power buses may be formed in metal 4 1502. Moreover, according to some such configurations, in addition to savings such as in chip area and/or cost, improved tracking may be provided in relation to the associated control signal(s) with such structures, especially as against sense amplifier enable signal(s) and the SBL selection signals for SRAMs.

Additionally, according to simulations analysis in the relevant technology, a 1K block (1024) of memory cells arranged into four SBLs in a 2×2 matrix consistent with the innovations herein has approximately 50% less capacitance in comparison to a conventional 1K memory cell bit line. In some implementations, the bit line parasitic capacitance reduction from aforementioned analysis is about 45% that of conventional bit line, and the junction capacitance reduction from aforementioned analysis is about 60% less that of conventional bit line. As such, implementations herein may achieve a total combined capacitance reduction of about 50%. Such analyses also show that a 2K block (2048) of memory cells utilizing the illustrative 2×2 SBL matrices consistent with the innovations herein may have a bit line capacitance that is approximately 50% less than that of a conventional 2K memory cells bit line. Therefore, as a results of the present innovations utilizing the sectioned bit line architecture(s) set forth above, systems and methods herein may approximately double the memory array density while maintaining the same speed and operation.

While various embodiments have been described above, it should be understood that they have been presented by way of example and not limitation. It will be apparent to persons skilled in the relevant art(s) that various changes in form and detail can be made therein without departing from the spirit and scope. For example, other memory cells beside 6T memory cells may be used in sectioned bit line, such as 4T, dual ports, and 1T memory cells. Also, the sectioned bit line architecture described herein may be adapted into different memory array configurations and memory compilers. In fact, after reading the above description, it will be apparent to one skilled in the relevant art(s) how to implement alternative embodiments. Thus, the present embodiments should not be limited by any of the above-described embodiments.

In addition, it should be understood that any figures which highlight functionality and advantages are presented for example purposes only. The disclosed methodologies and systems are each sufficiently flexible and configurable such that they may be utilized in ways other than those shown.

Further, the purpose of the Abstract of the Disclosure is to enable the U.S. patent and Trademark Office, the public generally, and especially the scientists, engineers, and practitioners in the art who are not familiar with patent or legal terms or phraseology, to determine quickly from a cursory inspection the nature and essence of the technical disclosure of the application. The Abstract of the Disclosure is not intended to be limiting as to the scope of the present invention in any way.

It should also be noted that the terms "a", "an", "the", "said", etc. signify "at least one" or "the at least one" in the specification, claims and drawings.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the appended claims and the applicable rules of law.

The invention claimed is:

1. An SRAM memory device comprising:
    a global bit line;
    a plurality of sectioned bit lines (SBLs) connected to the global bit line, each of the SBLs comprising:
        a local bit line;
        a plurality of memory cells connected to the local bit line;
        a local complement bit line connected to the memory cell; and
        a pass gate coupled to the local bit line;
    the global bit line being provided in a layer above or below the SBLs and configured in a parallel direction to the local bit lines, wherein the global bit line is not a sense line;
    wherein the SBLs are arranged in a matrices, each matrix comprising 2 or more SBLs arranged along the global bit line, the SBLs including multiple level column decoding to connect the SBLs to the global bit line;
    wherein an output of the pass gate within each SBL is coupled to the global bit line; and
    wherein the pass gates are configured, via coupling to at least one selection signal line, to connect the sectioned bit lines to the global bit line such that a selected pass gate of a selected SBL, when turned on, selectively passes data of the plurality of memory cells of the selected SBL to the global bit line, and unselected pass gates of unselected SBLs, when turned off, isolate the unselected SBLs from the global bit line.

2. The device of claim 1, wherein a drain of the pass gate is coupled to the local bit line.

3. The device of claim 1 further comprising a plurality of sectioned bit lines configured along a direction parallel to local bit lines associated with the plurality of sectioned bit lines.

4. The device of claim 1 further comprising a plurality of sectioned bit lines configured along a direction parallel to word lines associated with the plurality of sectioned bit lines.

5. The device of claim 1 further comprising first modules of sectioned bit lines (SBLs) configured along a direction parallel to local bit lines associated with the sectioned bit lines, and second modules of SBLs configured along a direction parallel to word lines associated with the sectioned bit lines.

6. The device of claim 1, wherein the global bit line and local bit line are oriented in a same direction.

7. The device of claim 1, further comprising a plurality of local section lines;
wherein the global bit line has an orientation that is orthogonal to an orientation of the local section lines.

8. The device of claim 1, wherein an SBL connects to each of the plurality of local section lines.

9. The device of claim 1 wherein the pass gate is a write pass gate defining a write path.

10. The device of claim 9 wherein the write pass gate is an NMOS device.

11. The device of claim 1 further comprising a read pass gate defining a read path.

12. The device of claim 11 wherein the read pass gate is an PMOS device.

13. The device of claim 1, wherein the local bit line is formed on a layer above or below the SRAM memory cell.

14. The device of claim 1, further comprising equalization circuitry that provides bit line equalization.

15. The device of claim 14 wherein the equalization circuitry includes a first transistor with drain coupled to the local bit line, a second transistor with drain coupled to the local complement bit line, and a third transistor with source coupled to the local bit line and drain coupled to the local complement bit line, wherein gates of the first, the second and the third transistors are coupled together to an equalization enable signal.

16. A Sectioned Bit Line (SBL) of an SRAM memory device, the SBL comprising:
a local bit line;
a plurality of memory cells connected to the local bit line;
a local complement bit line connected to a memory cell; and
a pass gate coupled to the local bit line;
wherein the SBLs are arranged in a matrices, each matrix comprising 2 or more SBLs arranged along the global bit line, the SBLs including multiple level column decoding to connect the SBLs to the global bit line;
wherein an output of the pass gate within each SBL is coupled to a global bit line, and the local bit line is connected to a drain of the pass gate to enable passing of that data on the local bit line to the global bit line without inversion;
wherein the pass gate is configured to selectively couple the SBL to the global bit line such that, when turned on via connection to a selection signal line, the pass gate selectively passes data of the plurality of memory cells of the SBL to the global bit line and, when turned off, isolates the SBL from the global bit to reduce parasitic capacitance and junction capacitance otherwise provided by sectioned bit lines without the selectively couple configuration.

17. The SBL of claim 16, wherein a drain of the pass gate is coupled to the local bit line.

18. The SBL of claim 16 wherein the pass gate is a write pass gate defining a write path.

19. The SBL of claim 18 wherein the write pass gate is an NMOS device.

20. The SBL of claim 16 further comprising a read pass gate defining a read path.

21. The device of claim 1, wherein the configuration of the pass gates reduces device cycle time, increases device operation speed, and/or reduces device size.

22. The SBL of claim 16, wherein the configuration of the pass gates reduces device cycle time, increases device operation speed, and/or reduces device size.

23. The device of claim 15 wherein the first, the second and the third transistors are PMOS transistors.

24. The device of claim 1, further comprising write recovery circuitry that provides write recovery of the SRAM memory device.

25. The device of claim 24 wherein the write recovery circuitry includes a first transistor with drain coupled to the local bit line, a second transistor with drain coupled to the local complement bit line, and a third transistor with source coupled to the local bit line and drain coupled to the local complement bit line, wherein gates of the first, the second and the third transistors are coupled together to a write recovery enable signal.

26. The device of claim 25 wherein the first, the second and the third transistors are PMOS transistors.

27. The device of claim 1, wherein the pass gate is a write pass gate defining a write path; and further comprising:
a read pass gate defining a read path.

28. The device of claim 27, wherein:
the write pass gate comprises an NMOS device; and
the read pass gate comprises a PMOS device.

29. The device of claim 27, wherein the write pass gate is configured to be controlled by a write operation signal.

30. The device of claim 27, wherein the read pass gate is configured to be controlled by a read operation signal.

31. The device of claim 1, wherein the local bit line and the global bit line are disposed on a top side of the SRAM memory device.

32. The device of claim 1, further comprising bit line equalization circuitry.

33. The device of claim 1, further comprising write recovery circuitry.

34. The device of claim 1, wherein the memory cells comprise 6T memory cell(s).

35. The device of claim 1, wherein the memory cells comprise 8T memory cell(s).

36. The device of claim 1, wherein the memory cells comprises 4T memory cell(s) or 1T memory cell(s).

37. The device of claim 1 or claim 36, wherein the SBLs are arranged in a plurality of rows and columns.

38. The device of claim 1, further comprising a sense amplifier coupled to the global bit line and/or the local bit line.

39. The device of claim 1, further comprising a data driver coupled to the global bit line and/or the local bit line.

40. The device of claim 1, wherein a capacitance of the global bit line is less than a capacitance of a comparable global bit line to which the memory cell is directly coupled.

41. The device of claim 1, wherein a memory cell active current is as large as an active current of a comparable global bit line to which the memory cell is directly coupled.

42. The device of claim 1, wherein an effective global bit line length is less than an effective global bit line length of a comparable global bit line to which the memory cell is directly coupled.

43. The SBL of claim 20 wherein the read pass gate is an PMOS device.

44. The SBL of claim 16, wherein the pass gate is a write pass gate defining a write path; and further comprising:
a read pass gate defining a read path.

45. The SBL of claim 44, wherein:
the write pass gate comprises an NMOS device; and
the read pass gate comprises a PMOS device.

46. The SBL of claim 18 or claim 45, wherein the write pass gate is configured to be controlled by a write operation signal.

47. The SBL of claim 20 or claim 45, wherein the read pass gate is configured to be controlled by a read operation signal.

48. The device of claim 1, wherein NMOS transistors are utilized for both the read pass gates and the write pass gates.

49. The device of claim 1, wherein PMOS transistors are utilized for both the read pass gates and the write pass gates.

50. The device of claim 1, wherein NMOS transistors and PMOS transistors are utilized for both the read pass gates and the write pass gates.

51. The device of claim 1 further comprising a complementary pass gate cell including read pass gate circuitry, which includes first transistors with gates connected to the local bit line and complement local bit line and sources coupled to drains of second transistors that have gates coupled to the read pass enable signal, and write pass gate circuitry, which includes transistors with drains coupled to the local bit line and complement local bit line, sources connected to the local data line(s) and gates connected to the write pass enable signal.

52. An SRAM memory device having local bit line, the memory device comprising:
    a global bit line arranged in a parallel direction to the local bit lines;
    a complement global bit line, being an inverse of the global bit line; and
    a plurality of sectioned bit lines (SBLs) coupled to the global bit line, each SBL comprising:
        a local bit line;
        a plurality of memory cells connected to the local bit line;
        a complement local bit line connected to the plurality of memory cells;
        a pass gate coupled to the local bit line; and
        a pass gate coupled to the complement local bit line;
    wherein the SBLs are arranged in a matrices, each matrix comprising 2 or more SBLs arranged along the global bit line, the SBLs including multiple level column decoding to connect the SBLs to the global bit line;
    wherein the pass gates are configured to connect the sectioned bit lines to the global bit line such that a selected pass gate of a selected SBL, when turned on, selectively couples and passes data of just the plurality of memory cells of the sectioned bit line to the global bit line and the unselected pass gates of the unselected SBLs, when turned off, isolate the unselected sectioned bit lines from the global bit line based on a selection signal received during operation of the memory device;
    wherein, as a function of the selective coupling/isolation of the SBLs to the global bit line, parasitic capacitance and junction capacitance from the SBLs to the global bit line is reduced and global bit line length is decreased.

53. The device of claim 52, wherein the configuration of the pass gates reduces device cycle time, increases device operation speed, and/or reduces device size.

54. The device of claim 52, wherein a drain of the pass gate is coupled to the local bit line.

55. The device of claim 52, wherein the configuration of the pass gates reduces device cycle time, increases device operation speed, and/or reduces device size.

56. The device of claim 52 further comprising a plurality of sectioned bit lines configured along a direction parallel to local bit lines associated with the plurality of sectioned bit lines.

57. The device of claim 52, wherein the configuration of the pass gates reduces operation time.

58. The device of claim 52 wherein the local bit line is formed on a layer above or below the SRAM memory cell.

* * * * *